(12) United States Patent
Shibata et al.

(10) Patent No.: US 11,990,314 B2
(45) Date of Patent: May 21, 2024

(54) SAMPLE PREPARATION SYSTEM AND METHOD FOR ELECTRON MICROSCOPE OBSERVATION, AND TAPE FEEDING MECHANISM USED FOR SAMPLE PREPARATION

(71) Applicants: SANYU ELECTRON CO., LTD., Tokyo (JP); KEIO UNIVERSITY, Tokyo (JP)

(72) Inventors: Shinsuke Shibata, Tokyo (JP); Tomoko Shindo, Tokyo (JP); Hideyuki Okano, Tokyo (JP); Shuichi Goto, Tokyo (JP)

(73) Assignees: SANYU ELECTRON CO., LTD., Tokyo (JP); KEIO UNIVERSITY, Tokyo (JP)

( * ) Notice: Subject to any disclaimer, the term of this patent is extended or adjusted under 35 U.S.C. 154(b) by 346 days.

(21) Appl. No.: 17/417,451

(22) PCT Filed: Dec. 26, 2019

(86) PCT No.: PCT/JP2019/051141
§ 371 (c)(1),
(2) Date: Jun. 23, 2021

(87) PCT Pub. No.: WO2020/138297
PCT Pub. Date: Jul. 2, 2020

(65) Prior Publication Data
US 2022/0068598 A1    Mar. 3, 2022

(30) Foreign Application Priority Data

Dec. 28, 2018  (JP) .................. 2018-248067

(51) Int. Cl.
*H01J 37/28*    (2006.01)
*G01N 1/28*     (2006.01)
*H01J 37/32*    (2006.01)

(52) U.S. Cl.
CPC ............. *H01J 37/28* (2013.01); *G01N 1/28* (2013.01); *H01J 37/32532* (2013.01); *H01J 2237/2602* (2013.01); *H01J 2237/2813* (2013.01)

(58) Field of Classification Search
CPC .. H01J 37/00; H01J 37/02; H01J 37/26; H01J 37/28; H01J 37/32532; H01J 2237/2602;
(Continued)

(56) References Cited

U.S. PATENT DOCUMENTS

| 5,652,029 A | 7/1997 | Itoh |
| 5,746,855 A | 5/1998 | Bolles |
| 2020/0051778 A1* | 2/2020 | Horstmann ............. H01J 37/28 |

FOREIGN PATENT DOCUMENTS

| DE | 102016202379 | 8/2017 |
| JP | H06-323967 | 11/1994 |

(Continued)

OTHER PUBLICATIONS

International Search Report dated Mar. 24, 2020 with respect to No. PCT/JP2019/051141.
(Continued)

*Primary Examiner* — Jason L McCormack
(74) *Attorney, Agent, or Firm* — IPUSA, PLLC

(57) ABSTRACT

Sample preparation system and method which enable electron microscope observation of a sample slice with simple structure and process are provided. The sample preparation system includes at least one of a plasma treatment apparatus and a sputtering apparatus, as well as a slice collecting apparatus. The plasma treatment apparatus is configured to feed a resin tape in a plasma irradiation area to irradiate the resin tape with plasma, thereby continuously hydrophilizing the resin tape. The sputtering apparatus is configured to feed the resin tape in a sputtering area to continuously perform
(Continued)

sputtering on the resin tape, thereby imparting conductivity to the resin tape. The slice collecting apparatus is configured to serially collect slices cut out from a sample onto the resin tape having been subjected to plasma treatment or sputtering.

11 Claims, 18 Drawing Sheets

(58) Field of Classification Search
CPC . H01J 2237/2813; G01N 1/28; G01N 1/2813; G01N 1/06; G01N 23/2202; G01N 23/2204; G01N 2001/362; G01N 35/00009
USPC ... 250/306, 307, 311, 492.1, 492.21, 492.22, 250/492.3
See application file for complete search history.

(56) References Cited

FOREIGN PATENT DOCUMENTS

| JP | H07-256087 | 10/1995 |
|---|---|---|
| JP | 2001-502430 | 2/2001 |
| JP | 2001-153765 | 6/2001 |
| JP | 2001-215181 | 8/2001 |
| JP | 2001-235402 | 8/2001 |
| JP | 2014-037985 | 2/2014 |
| JP | 2016-085119 | 5/2016 |
| JP | 2018-009247 | 1/2018 |
| WO | 2018/073443 | 4/2018 |

OTHER PUBLICATIONS

H. Iwasaki, "Automated Tape-Collecting System Ultra-Microtome (ATUM) for Three-Dimensional Reconstruction of Biological Tissue", Japanese Society of Microscopy, 176-180, vol. 49, No. 3 (2014).

Kubota Yoshiyuki et al: "A carbon nanotube tape for serial-section electron microscopy of brain ultrastructure", Nature Communications, vol. 9, No. 1, Dec. 1, 2018 (Dec. 1, 2018), XP055882961, DOI: 10.1038/s41467-017-02768-7 Retrieved from the Internet: URL: https://www.nature.com/articles/s41467-017-02768-7.pdf> * p. 2, last paragraph; figure 1.

Extended European Search Report dated Feb. 3, 2022 with respect to the corresponding European patent application No. 19903278.0.

* cited by examiner

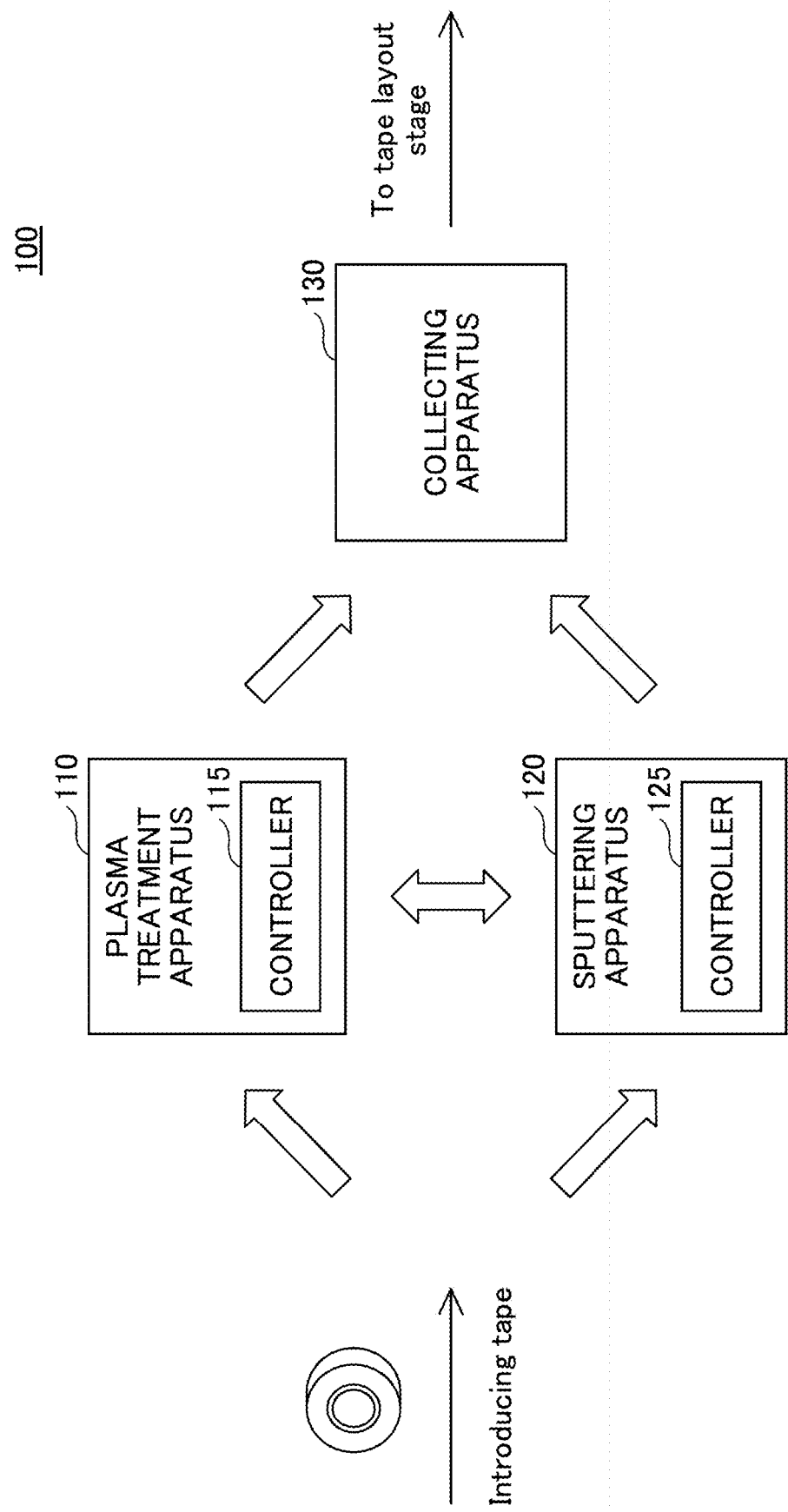

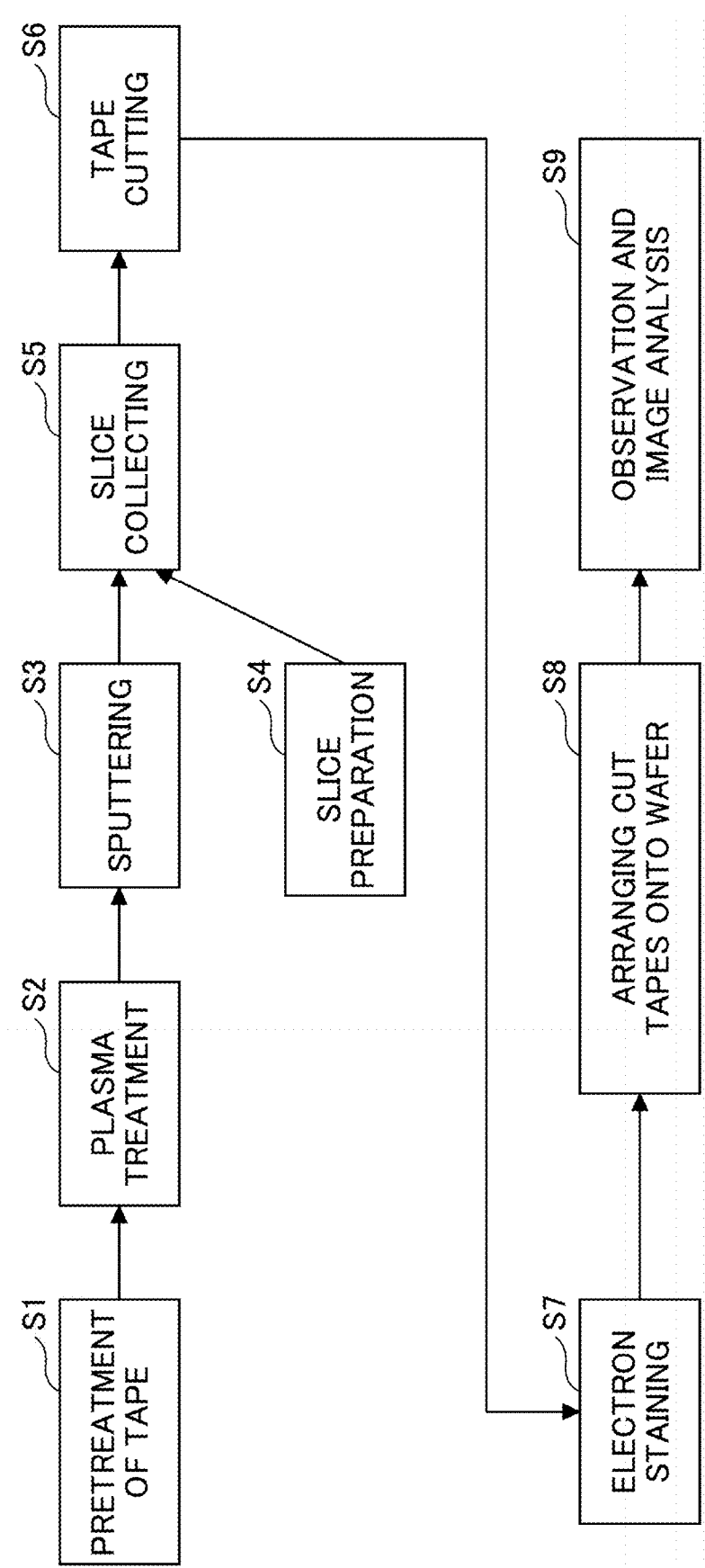

FIG.5
(a) PLAN VIEW
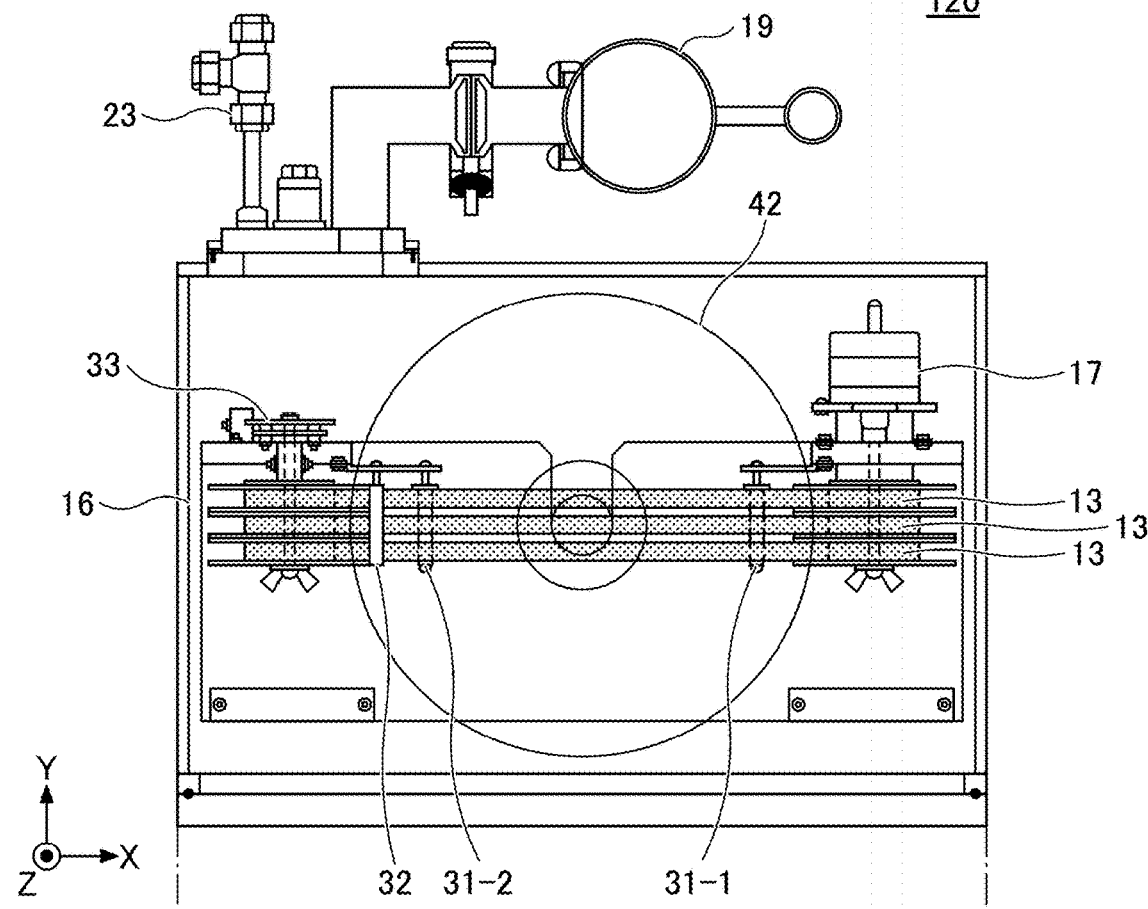
(b) FRONT VIEW
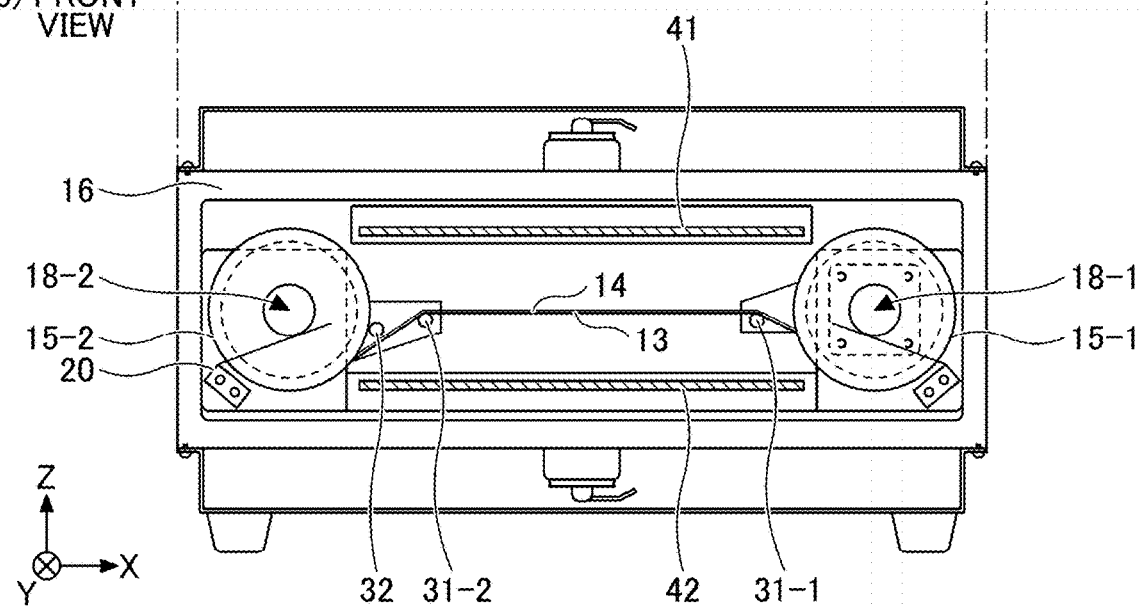

FIG.11
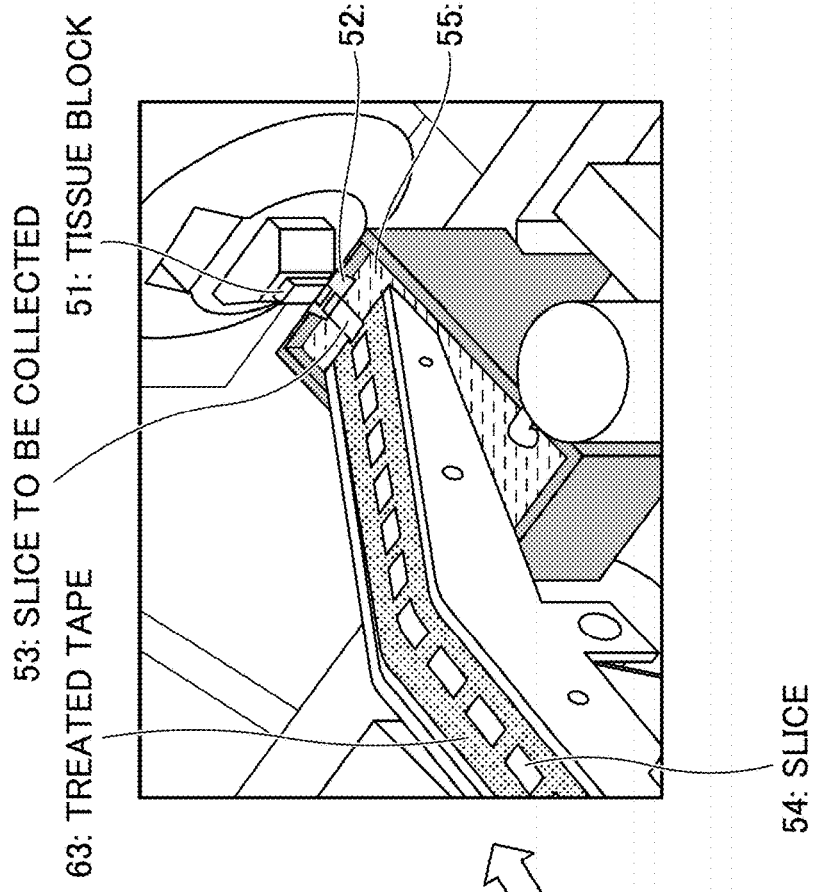
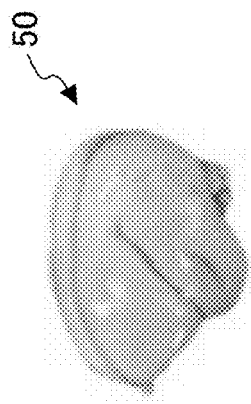

(A) EXAMPLE OF SERIAL IMAGES AND PARTIALLY MAGNIFIED IMAGE (B) REFERENCE IMAGE: CONTRAST OF HEAVY-METAL-COATED SAMPLE WITHOUT CONDUCTIVE COATING ON TAPE

SAMPLE PREPARATION SYSTEM AND METHOD FOR ELECTRON MICROSCOPE OBSERVATION, AND TAPE FEEDING MECHANISM USED FOR SAMPLE PREPARATION

TECHNICAL FIELD

The present invention relates to sample preparation for electron microscope observation, and more particularly, to a sample preparation system and method for electron microscope observation, which are configured to collect slices of a biological tissue onto a resin tape having been subjected to at least one of a hydrophilic treatment or a surface treatment for imparting conductivity. The present invention also relates to a plasma treatment apparatus, a sputtering apparatus, and a tape feeding mechanism used for the sample preparation.

BACKGROUND ART

Conventionally, for observing a biological tissue with a scanning electron microscope, samples are prepared by slicing a resin-embedded biological tissue with a microtome, mounting the slices onto a plastic tape, and arranging the plastic tape in sequence on a flat plate such as a silicon wafer.

In recent years, an automated system for continuously collecting tissue slices for electron microscope observation has been developed. Many laboratories use this system to collect tissue slices onto a plastic tape.

With this system, a resin-embedded sample is cut into slices using a diamond knife. The slices are floated on water, and collected one by one from the water onto a tape which is running synchronized with the slicing timing. See, for example, Non-Patent Document 1 presented below.

However, due to static electricity generated on the plastic tape, or due to water repellency of the plastic tape itself, the slices collected onto the plastic tape get wrinkled or repelled.

If such a slice is observed as it is on the plastic tape with a scanning electron microscope, the slice is charged, and microscope observation becomes difficult. To avoid this inconvenience, conductive coating such as carbon coating is applied to the plastic tape over the slices in order to impart electric conductivity to the plastic tape prior to the observation with the scanning electron microscope (see Non-Patent Document 1). The ideal is that the tape itself is made of a conductive material such as a metal; however, conductive materials generally have poor surface flatness, and are unsuitable for slice mounting tapes.

Meanwhile, an apparatus for performing plasma treatment on the surface of a magnetic tape is proposed (see, for example, Patent Document 1). An apparatus for performing sputtering on a long film is also known (see, for example, Patent Document 2). These conventional apparatuses for plasma treatment or sputtering are intended for industrial use, and have complicated and large-sized structures.

PRIOR ART DOCUMENTS

Patent Document 1: JP H07-256087 A
Patent Document 2: JP 2018-9247 A
Non-Patent Document 1: Automated Tape-Collecting System Ultra-Microtome (ATUM) for Three-Dimensional Reconstruction of Biological Tissue, Japan Society of Microscopy, 176-180, Vol, 49, No. 3 (2014)

SUMMARY

Technical Problem(s) to be Solved

The present invention was conceived to solve the above-described technical problems, and one of the objectives of the invention is to provide a sample preparation technique for electron microscope observation of a biological tissue slice, which has a simplified process and structure compared with the conventional technique.

In particular, by performing at least one of a plasma treatment for reducing static electricity or water repellency at the tape surface, or a sputtering treatment for imparting conductivity to the tape, a simple configuration and process of sample preparation system and method for electron microscope observation of a biological tissue slice can be achieved.

Means For Solving the Technical Problem(s)

The inventors found that, by hydrophilizing the surface of a resin tape in advance, tissue slices can be serially collected on the tape and easily and reliably fixed onto the tape in a flat state. The inventors also found that, by imparting conductivity to the surface of the resin tape in advance, tissue slices mounted on the resin tape can be observed at high contrast and high resolution by a scanning electron microscope, without charging even if no conductive film such as carbon coat is formed over the slices on the resin tape.

The present invention was conceived based on the above findings. In one aspect of the invention, a sample preparation system for electron microscope observation includes at least one of a plasma treatment apparatus and a sputtering apparatus, the plasma treatment apparatus being configured to feed a resin tape in a plasma irradiation area to irradiate the resin tape with plasma, thereby continuously hydrophilizing the resin tape, and the sputtering apparatus being configured to feed the resin tape in a sputtering area to continuously perform sputtering on the resin tape, thereby imparting conductivity to the resin tape, and a collecting apparatus configured to serially collect slices cut out from a sample onto the resin tape having been subjected to plasma treatment or sputtering.

According to this sample preparation system for electron microscope observation, by hydrophilizing the surface of the resin tape using the plasma treatment apparatus, the slice can be maintained in a flat state, while suppressing repelling, on the resin tape which may have water repellency or static electricity. By imparting conductivity to the resin tape using the sputtering apparatus, high contrast and high resolution imaging is achieved without charging during scanning electron microscope observation.

With the plasma treatment apparatus used in the sample preparation system for electron microscope observation, the surface of a tape, which is made of a plastic material having water-repellency or tendency of generating static electricity, can be hydrophilized by a simplified process and apparatus. Biological tissue slices can be mounted and maintained in a flat state on the tape.

With the sputtering apparatus used in the sample preparation system for electron microscope observation, the surface of a non-conductive tape such as a plastic tape is imparted with conductivity by performing surface treatment using a simplified apparatus or process, thereby enabling electron microscope observation of a biological tissue slice.

Sample preparation for electron microscope observation of a biological tissue slice can be achieved with a simpler structure and method. The sample preparation method and system for electron microscope observation of the present invention achieve serial observation of biological tissue slices at a high contrast and a high resolution using an electron microscope.

BRIEF DESCRIPTION OF DRAWINGS

FIG. 1A is a schematic diagram of a sample preparation system for electron microscope observation according to an embodiment;

FIG. 1B shows an overall process of electron microscope observation according to an embodiment;

FIG. 5 shows a configuration of a sputtering apparatus (Example 2: surface treatment for imparting conductivity);

FIG. 11 shows a detailed process of slice preparation (S4) and slice collecting (S5) according to an embodiment;

MODES FOR IMPLEMENTING THE INVENTION(S)

Figure 2:
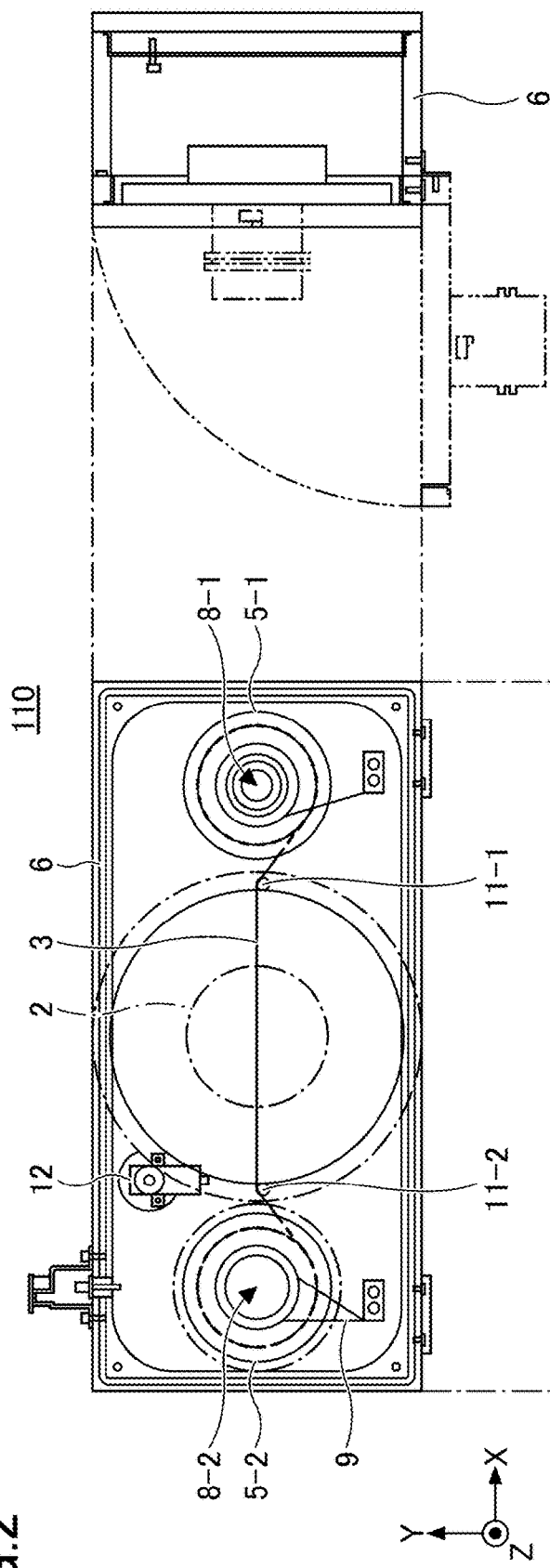
FIG. 2 shows a configuration of a plasma treatment apparatus (Example 1: hydrophilization treatment) according to an embodiment.

In a sample preparation system for electron microscope observation according to an embodiment, a hydrophilization treatment and/or a conductivity-imparting treatment is(are) performed continuously on the surface of a tape which is to be used for mounting samples. Slices of the sample are serially collected onto the surface-treated tape. The tape for mounting the sample slices is, for example, a resin tape. The resin tape on which sample slices have been serially collected by the sample preparation system of the embodiment is then arranged onto a substrate, such as a silicon wafer or a glass substrate, in a form suitable to observation with, for example, a scanning electron microscope. The slices can be observed and/or imaged at a high contrast and a high resolution, without charging, even if no conductive coating is carried out after the slices have been collected onto the tape. In the following descriptions, acquisition of observed images is also included in the electron microscope observation, unless otherwise specified.

FIG. 1A is a schematic diagram of a sample preparation system 100 for electron microscope observation according to an embodiment. The sample preparation system 100 for electron microscope observation includes one or both of a plasma treatment apparatus 110 and a sputtering apparatus 120, as well as a collecting apparatus 120. A pretreated tape is introduced into the plasma treatment apparatus 110 or the sputtering apparatus 120. When both the plasma treatment and the sputtering treatment are performed, either process may be performed first. Because plasma treatment has a surface purification effect, the sputtering treatment for imparting conductivity may be performed after the plasma treatment.

The tape to be introduced is one used for mounting slices of a biological sample, and the width of the tape is, for example, from 1 mm to 10 mm. Preferably, the width of the tape may be several millimeters or less. The plasma treatment apparatus 110 and the sputtering apparatus 120 have compact and efficient tape feeding mechanisms to efficiently perform plasma treatment or sputtering on a narrow surface of the tape.

The plasma treatment apparatus 110 has a controller 115 to control the overall operations of the plasma treatment apparatus 110, and individual operations of the components. The sputtering apparatus 120 has a controller 125 to control the overall operations of the sputtering apparatus 120, and the individual operations of the components. It may be unnecessary to provide individual controllers to each of the plasma treatment apparatus 110 and the sputtering apparatus 120, and instead, an external data processor such as a personal computer may be used in common between the two apparatuses.

The resin tape which has been subjected to the plasma treatment and/or the sputtering is then wound up around a reel, and set in the collecting apparatus 130 such that the slices of a samples are serially collected onto the tape. Because one or both of the plasma treatment for hydrophilization and sputtering for imparting conductivity is/are applied in advance to the surface of the resin tape, the slices are serially and accurately collected at predetermined positions on the tape, while suppressing undesired charging.

The resin tape on which the sample slices are mounted may be arranged on a substrate in an appropriate format suitable for electron microscope observation and/or suitable for library, on a tape layout stage. The tape can be transported between the apparatuses manually by the operator, or automatically by a robot arm or an automated transport system.

FIG. 1B illustrates an overall process of sample preparation and electron microscope observation using the prepared sample. The particulars of the sample preparation and electron microscope observation will be described one by one below. Step S1 is pretreatment of the tape.

(1) Resin Tape

A resin tape may have a stretch resistance (anti-stretching), surface flatness, chemical resistance, and/or heat resistance. A chemical resistant resin tape has a tolerance to deformation or degradation even during electron staining using uranium or lead, the process of which will be described later. A heat resistant resin tape has a tolerance to deformation or degradation during the plasma treatment or the sputtering process.

Examples of the resin tape having at least one of the above-described properties include, but are not limited to polyimide, polycarbonate, polyetheretherketone (PEEK), polyethylene terephthalate (PET), and polyethylene naphthalate (PEN). The resin material to be used is selected according to the type of electron microscope observation. For example, when electron microscope observation and fluorescence observation are simultaneously performed using the same sample slice, a material that can suppress autofluorescence in the tape is preferable. Autofluorescence is spontaneous fluorescence generated from a resin material itself. Such spontaneous fluorescence becomes noise with respect to the fluorescence emitted from an artificially added marker. Polycarbonate may be used as the tape material that does not cause autofluorescence. PET and polyimide have fluorescence emission at specific wavelengths, and PEEK has colors at almost all wavelengths. These materials are also appropriately used depending on the type of electron microscope observation.

The ideal is that the tape itself is electrically conductive. However, in general, conductive materials (such as metal) do not have sufficient surface flatness or chemical resistance. For example, aluminum may have sufficient flatness, but its chemical resistance is poor. Accordingly, an aluminum tape may be unsuitable to electron microscope observation. Therefore, a resin tape is used in the embodiment.

The width of the resin tape may be determined according to the configuration of a diamond knife boat, which is used in the collecting apparatus 130 to cut a biological tissue into slices. The width of the resin tape is generally 2.5 mm to 10 mm, and the tape width about 7.5 mm to 8.0 mm is adequate. Similarly, the thickness of the resin tape may be determined according to the configuration of the diamond knife boat, and the tape thickness is preferably 30 μm to 70 μm. With the tape thickness of 30 μm or more, it is easy to handle the tape. With the tape thickness of 70 μm or less, the slices can be smoothly collected onto the tape using a typical diamond knife boat.

(2) Pretreatment of Tape (S1)

First, the surface of the resin tape is cleaned in the tape pretreatment step (S1). In this pretreatment, the surface of the resin tape is wiped off with ethanol or the like to roughly remove dust or contamination from the surface of the resin tape. The resin tape cleaned by the pretreatment step is then wound around a reel to be used in the plasma treatment apparatus. Then, the process proceeds to the next step S2.

(3) Plasma Treatment (S2)

In step S2 of FIG. 1B, plasma treatment is performed, in which the surface of the resin tape is irradiated with plasma for hydrophilization. Through this plasma treatment, fine contaminants on the tape surface can be removed. Prior to the plasma treatment, the reel with the resin tape wound up is set in the plasma treatment apparatus 110. The reel is rotated to feed the resin tape between a pair of electrodes provided in the plasma irradiation area inside the chamber of the plasma treatment apparatus 110. While the resin tape runs through the plasma irradiation area, the tape surface is irradiated with plasma.

FIG. 2 shows a configuration example of the plasma treatment apparatus 110 used in the embodiment in a plan view (a), a front view (b), and a side view (c). The tape feeding direction is the X direction, the height direction of the apparatus is the Z direction, and the direction perpendicular to both the X direction and the Z direction is the Y direction.

The plasma treatment apparatus 110 shown in FIG. 2 has the pair of plasma electrodes 2 which face each other and serve as a positive electrode and a negative electrode. The pair of plasma electrodes 2 is formed as, for example, metal disks arranged parallel to each other in the height direction of the apparatus. The plasma electrodes 2 may have a size capable of irradiating a wafer of 4, 5, 6, 7, or 8 inches with plasma. The orientation the plasma electrodes 2 is not limited to the horizontally provided top and bottom electrodes, as long as the two electrodes face each other. The two metal disks may be arranged perpendicularly (parallel to the X-Z plane), depending on the installation state of the plasma treatment apparatus 110. In the example of FIG. 2, stainless steel is used for the plasma electrodes 2; however, other suitable materials which can suppress metal release due to electric discharge may be used. The tape 3 introduced in the above-described resin tape. The tape 3 is fed in tension between the pair of plasma electrodes 2 such that the tape surface is perpendicular to the electrode surfaces.

The plasma treatment apparatus 110 has a spindle 8-1 configured to receive a reel 5-1 (a first reel) to wind up the tape 3, and a spindle 8-2 configured to receive a reel 5-2 (a second reel) at the feeder side. Protrusions or indentations may be formed in the outer surface of the spindles 8-1 and 8-2, while indentation or protrusions may be formed in the outer surfaces of the reel shafts of the reels 5-1 and 5-2. By fitting the protrusions into the indentations, the reels 5-1 and 5-2 are fixed to the spindles 8-1 and 8-2.

The entirety of the plasma treatment apparatus 110 is placed in a casing 6. As shown in FIG. 2, the casing 6 is a container (or a chamber) capable of vacuum evacuation, in which the plasma electrodes 2, the reels 5-1 and 5-2, the tape 3 fed between the reels, and other components can be accommodated. A vacuum evacuation mechanism such as a vacuum pump (not shown) is provided to the casing 6 to evacuate the inner space of the casing 6. A door with a window may be provided to the top of the casing 6, namely, above the plasma electrodes 2. By opening and closing the door, the tape 3 is set in and taken out of the casing 6. The door window may be made of a transparent plate such that the inside of the casing 6 is visually monitored. From the viewpoint of heat resistance and chemical resistance, a transparent resin substrate (such as acrylic resin plate or a polycarbonate plate), or a glass plate may be used as the transparent window.

As has been described above, the tape 3 is fed in the plasma treatment apparatus 110 such that the tape surface is perpendicular to the surfaces of the plasma electrodes 2. With this configuration, both surfaces of the tape 3 are simultaneously irradiated with plasma between the plasma electrodes 2 in the plasma irradiation area. To achieve this, the reels 5-1 and 5-2 are placed in the casing 6 so as to be parallel to the disk plane of the plasma electrodes 2. Although FIG. 2 illustrates a configuration with a single tape 3 being fed, two or more sets of reels may be provided in the apparatus. In this case, two or more reels are stacked with a certain gap between them so that two or more tapes 3 are introduced in the plasma treatment apparatus 110. When two or more tapes 3 are set in the apparatus, one of the reels 5-2 placed on the feeder side is fixed to the spindle 8-2, and the rest of the reels 5-2 may be set free to rotate around the spindle 8-2. With such a configuration, even if the number of turns differs among the tapes 3, the individual tapes 3 can continuously and stably undergo the plasma treatment, without slacking. It is preferable that the tape with the highest number of turns, namely, the tape which will run at the fastest speed, is installed on the reel 5-2 fixed to the spindle 8-2.

The plasma treatment apparatus 110 has a power supply (not illustrated) to apply a voltage between the plasma electrodes 2, and a current regulator (not illustrated) to control the current level through an electric circuit, such that a predetermined quantity of plasma current flows between the plasma electrodes 2. The voltage applied from the power supply may either be a DC voltage or an AC voltage, and even a radio frequency (RF) power supply may be used. In terms of downsizing the apparatus, direct current power supply is preferable.

A driver 7 drives and rotates the spindle 8-1. The rotating speed is automatically controlled by an electric circuit, whereby the reel 5-1 fixed to the spindle 8-1 is rotated to wind the tape 3 at a predetermined speed. The feeder-side spindle 8-2 which receives the reel 5-2 is rotated by the tension of the tape 3 being wound by the reel 5-1. By rotating the spindle 8-1 by the driver 7, the tape 3 is wound from the reel 5-2 to the reel 5-1 at a predetermined feeding speed. The driver 7 is, for example, a motor with a decelerator. An appropriate braking condition may be experimentally determined in advance. The motor speed may be variable by, for example, six gears in a stepwise manner, within the range of 5 to 30 seconds per revolution (e.g., 26.5 sec/rev, 16.5 sec/rev, 10.0 sec/rev, 6.0 sec/rev, 5.6 sec/rev, etc.).

The plasma treatment apparatus 110 has a brake mechanism 9 which applies a frictional force to the spindle 8-2 to control the rotation speed. The brake mechanism 9 can be configured by, for example, setting a long plate in the casing 6 so that a part of the long plate is in contact with the outer periphery of the spindle 8-2. One end of the long plate is fixed inside the casing 6, and the other end is brought into contact with the outer periphery of the spindle 8-2, such that a frictional force is generated between the spindle 8-2 and the long plate to control the rotation speed of the spindle 8-2. For the long plate, a material tolerant to plasma treatment with little deterioration and having a certain degree of elasticity can be used. Examples of such a material include stainless steel such as SUS. When the long plate is made of a metal such as stainless steel, a resin sheet may be provided onto the outer surface of the spindle 8-2 at the position where the metal plate comes into frictional contact with the spindle. Depending on the type of resin, the frictional force generated at the spindle 8-2 can be adjusted so as to regulate the rotation speed. Specifically, a resin with a low reactivity during the plasma treatment, such as Teflon (registered trademark), can be used. In the plasma treatment apparatus of the embodiment, the spindle 8-1 also has a similar braking mechanism; however, the braking mechanism may be provided to only one of the spindles, as necessary.

Figure 3:
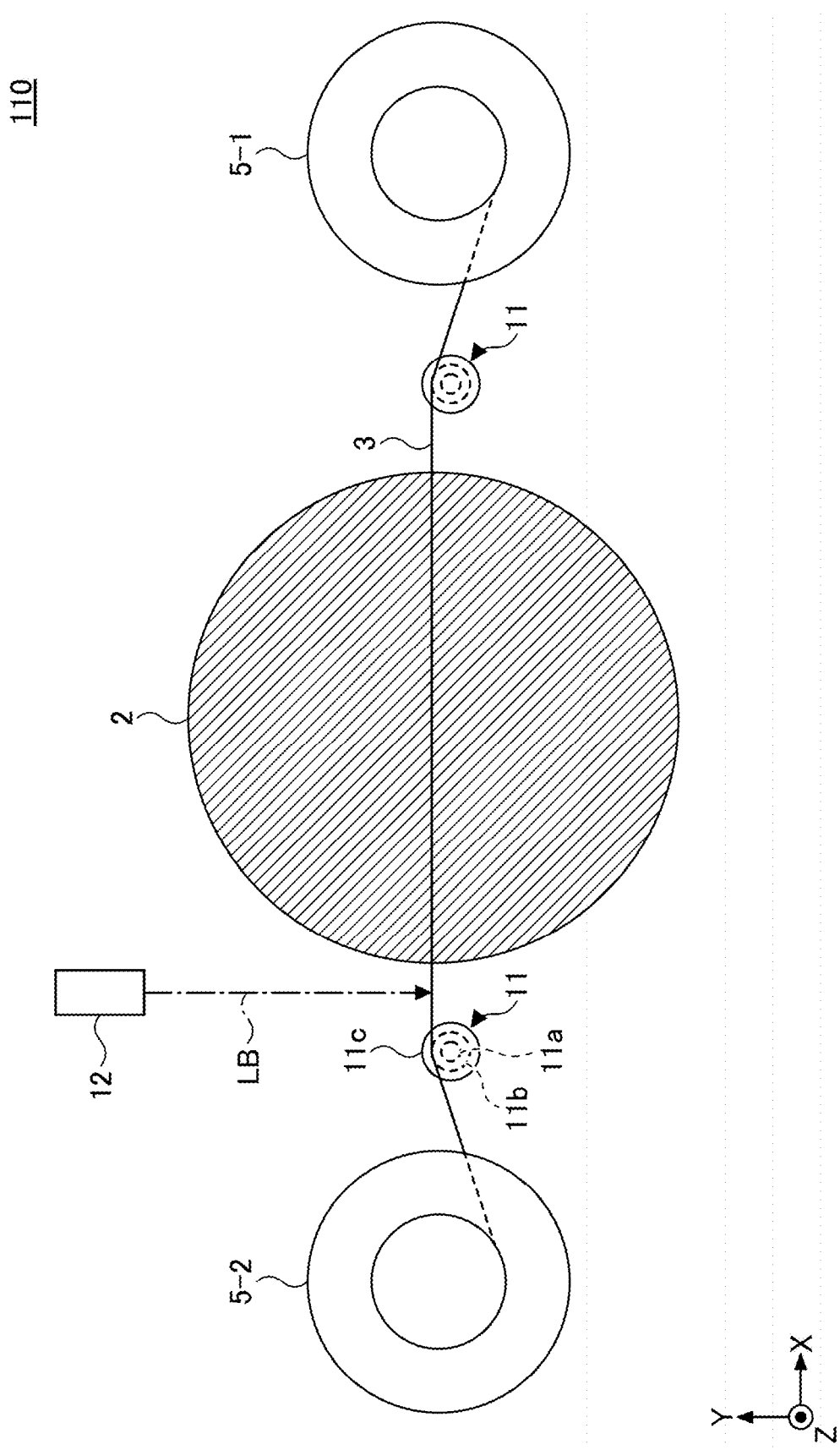
FIG. 3 is a schematic diagram showing how a tape is guided by guide shafts in the plasma treatment apparatus according to an embodiment.

The plasma treatment apparatus 110 has a guide shaft 11 configured to guide the tape fed out from the reel 5-2. FIG. 3 is a schematic diagram illustrating how the tape 3 is guided by the guide shaft 11, in a plan view of the X-Y plane parallel to the plasma electrode 2. The guide shafts 11 are provided between the plasma electrode 2 and the reel 5-1, and between the plasma electrode 2 and the reel 5-2. The guide shafts 11 are provided to guide the tape 3 so as to pass through the center area of the plasma electrode 2. The guide shaft 11 has a cylindrical shaft 11a, an outer cylinder 11b surrounding the cylindrical shaft 11a, and stopper plates 11c. The outer cylinder 11b is provided so as to freely rotate around the cylindrical shaft 11a. The stopper plates 11c are provided to both ends of the guide shaft 11 so as to prevent the tape 3 from coming off the shaft guide 11. The stopper plates 11c are made of, for example, disks having a diameter greater than the inner diameter of the guide shaft 11. By feeding the tape 3 so that the tape surface is in contact with the outer cylinder 11b of the guide shaft 11, the tape 3 is guided so as to pass through the center area of the plasma irradiation area, whereby both surfaces of the tape 3 are uniformly hydrophilized. How the hydrophilization is proceeding can be judged by dropping a water droplet onto the tape surface. If the water droplet spreads over the tape surface, without remaining as a droplet, it may be judged that the tape surface is sufficiently hydrophilized.

The plasma treatment apparatus 110 has a sensor 12 to confirm whether the tape 3 is running through the plasma irradiation area. The sensor 12 has, for example, a light source for emitting a light beam, and a photodetector which detects the light beam emitted from the light source and reflected from the tape 3. The light beam emitted from the light source has a wavelength reflective at the tape 3. The sensor 12 is provided so that the light beam emitted from the light source is incident on and normal to the surface of the tape 3. In the embodiment using the resin tape 3, the light source may be an infrared light emitting device (LED). As has been described above with reference to FIG. 1A, the plasma treatment apparatus 110 has a controller 115. When the photodetector of the sensor 12 does not detect the light beam reflected from the tape 3, the controller 115 determines that the tape 3 is out of the path through the plasma irradiation area, and stops the driver 7 and the power supply.

By furnishing the plasma treatment apparatus 110 with a tape feed mechanism, which includes reels 5-1 and 5-2, spindles 8-1 and 8-2, guide shafts 11, the driver 7, and the braking mechanism 9, and with a sensor 12 for detecting the running state of the tape 3, the plasma treatment apparatus 110 can be made simple and compact.

Figure 4:
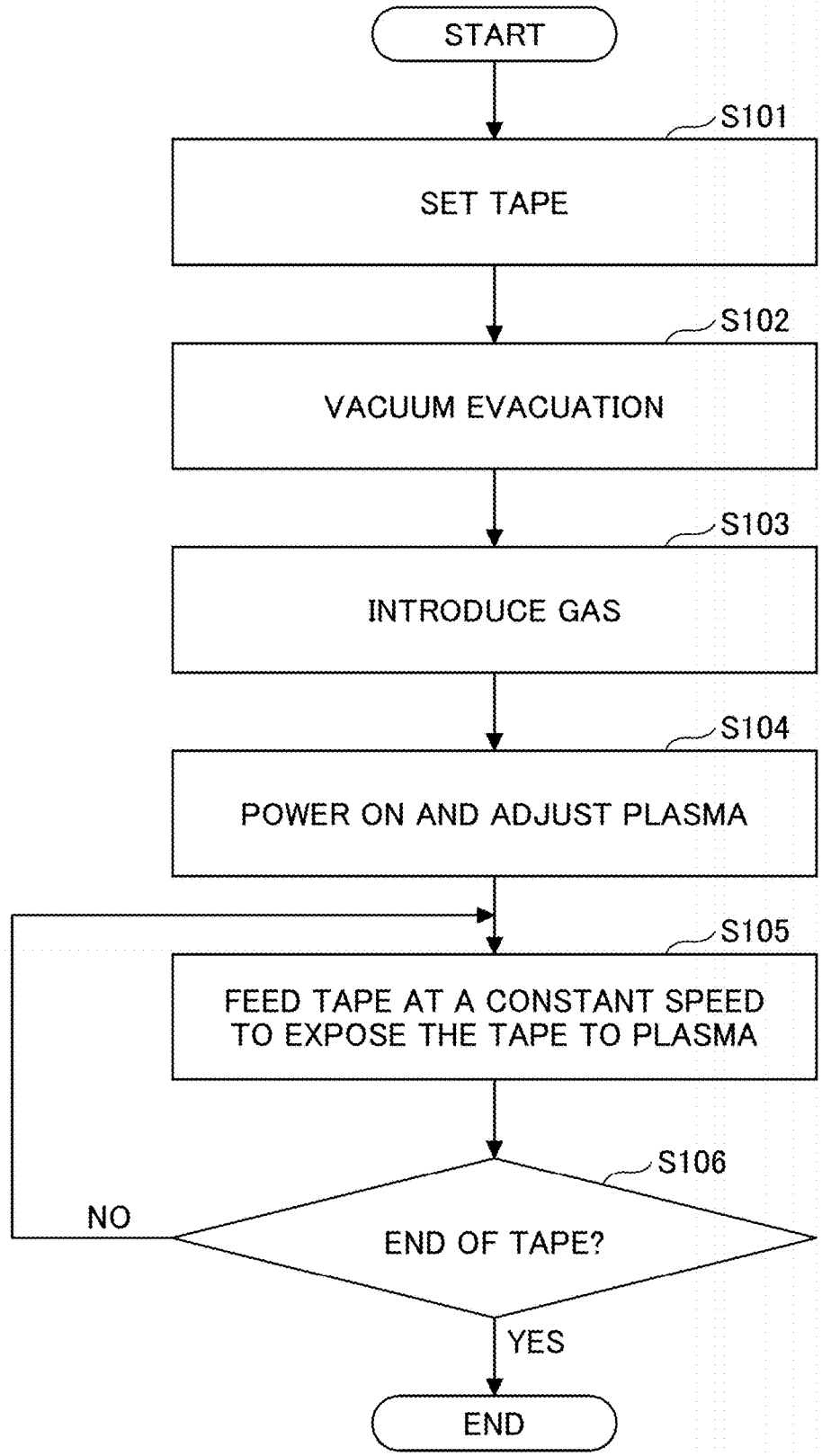
FIG. 4 is a flowchart showing operations of the plasma treatment according to an embodiment.

FIG. 4 is a flowchart showing detailed operations of the plasma treatment step S2 of FIG. 1B. The plasma treatment will be explained according to the process flow of FIG. 4.

In S101 of FIG. 4, the tape 3 is set in the plasma treatment apparatus 110. The door with a window of the casing 6 in FIG. 2 is opened, and the reel around which the tape 3 to be hydrophilized has been wound in advance is placed at the position of the reel 5-2 on the feeder side of the plasma treatment apparatus 110. One end of the tape 3 is pulled out, and brought into contact with the guide shaft 11 so as to let the tape pass through the center of the casing 6. The tape 3 is then put into the reel 5-1 at the wind-up side. The reel 5-1 is slightly rotated to wind up the tape 3. Then, the driver 7 is driven to confirm that the tape 3 is fed in the right direction (in X direction of FIG. 2).

In S102, vacuum evacuation is performed to evacuate the chamber of the plasma treatment apparatus 110. After the tape 3 is set in tension between the reels 5-2 and 5-1 in S101, the top door is closed and vacuum evacuation is carried out. The pressure in the chamber after the vacuum evacuation is about 6 Pa to 8 Pa, at most.

In S103, a gas is introduced into the chamber. After the evacuation of S102, a desired gas is introduced as necessary, and the gas pressure is adjusted to a predetermined level. As the atmosphere of the plasma treatment, oxygen or the air (at the nitrogen to oxygen ratio of 3 to 1 in volume) can be used. Using oxygen is preferable because the plasma current is stable. The pressure can be experimentally determined in advance. When oxygen is used as the gas, a pressure ranging from 6 Pa to 20 Pa is sufficient.

In S104, a voltage is applied between the plasma electrodes 2 and the current level flowing between the plasma electrodes 11 is adjusted. The plasma voltage is applied in the atmosphere of the casing 6 having been adjusted in S103, such that the plasma current flows at the predetermined level.

The plasma current of about 25 mA is sufficient for hydrophilization of the tape. When the hydrophilization is carried out under the above-described condition, the hydrophilic state of the tape lasts for about one or two weeks after the plasma treatment without problems. If the hydrophilic state is degraded due to long-term storage, plasma irradiation may be performed again. It is preferable that the optimum plasma current level, tape feed speed, gas atmosphere, gas pressure, gas type, etc. are experimentally determined in advance, according to the type and/or the size of the sample used for electron microscope observation.

In S105, the tape 3 is fed at a constant speed through the plasma irradiation area between the plasma electrodes 11 to irradiate the surface of the tape 3 with plasma. After the plasma voltage and the plasma current have been adjusted to the appropriate levels for hydrophilization in S104, the driver 7 is driven to rotate the spindle 8-1 at a predetermined revolution rate. As a result, the tape 3 runs at a predetermined speed, and both sides of the tape 3 are continuously hydrophilized at the same time. From the viewpoint of sufficient hydrophilization, the tape feed speed is preferably about 30 seconds to 1 minute per 200 mm when the plasma current is about 25 mA. The tape stay time may be increased as necessary.

In S106, it is determined whether the tape feeding has been completed (or whether the tape end has been detected). When the driver 7 is driven in S105, the controller 115 controls the sensor 12 to emit infrared light from the light source onto the tape 3. As long as the infrared light reflected from the tape 3 is detected by the photodetector, it is determined that the tape 3 is running through the plasma irradiation area. If the reflected light is no longer detected, the controller 115 determines that the tape 3 is not running in the plasma irradiation area, and that the hydrophilization of the tape 3 wound around the reel 5-1 has been completed. If the output of the sensor 12 indicates the detection of the tape end, the driver 7 and the power supply are turned off to stop the feeding of the tape 3, and the process terminates. If the tape end has not been detected (NO in S106), S105 is repeated.

In this manner, the plasma treatment apparatus 110 is operated to feed the tape 3 at a predetermined speed so that the tape surface is perpendicular to the electrode surface of the plasma electrodes 2. With this tape orientation, both surfaces of the tape 3 can be simultaneously and uniformly irradiated with plasma, and continuous hydrophilization is performed. As a result, a resin tape with hydrophilized surfaces is fabricated.

(4) Sputtering (S3)

Returning to FIG. 1B, sputtering step S3 is performed to impart conductivity to the tape surface by sputtering a conductive heavy metal onto the surface of the resin tape. First, in step S3, the reel around which the resin tape is wound is set in the sputtering apparatus 120. The reel is rotated to feed the resin tape between the sputter electrodes (in the sputtering area) in the chamber of the sputtering apparatus 120. FIG. 5 shows an example of the configuration of the sputtering apparatus 120 according to an embodiment, which is illustrated in a plane view (a) and a front view (b). The tape feeding direction is the X direction, the height direction of the apparatus is the Z direction, and the direction orthogonal to both the X direction and the Z direction is the Y direction.

The sputtering apparatus 120 shown in FIG. 5 has a pair of sputter electrodes 41 and 42. The sputter electrodes 41 and 42 are, for example, disc-shaped electrodes provided so as to face each other in the height direction of the apparatus, and the sputter electrodes 41 and 42 may have a size capable of sputtering on a 4, 5, 6, 7, or 8 inch wafer. The tape 13 is the above-described resin tape. The orientation of the sputter electrodes 41 and 42 is not limited to the top and bottom configuration, as long as they face each other, and a left and right configuration may be adapted, depending on the installation state of the sputtering apparatus 120.

The sputter electrode 41 is formed of a sputtering target of a conductive heavy metal, and serves as a negative electrode. Such a sputtering target may be made of Au, Ag, Pt, Pd, or an alloy of two or more of these materials. In terms of good imaging for electron microscope observation, a gold target or a Pt—Pd alloy target is preferable, and of these, a gold target is more preferable. The ratio of Pt to Pd (Pt/Pd) of the Pt—Pd alloy target is, for example, about 90/10 by mass ratio.

The sputter electrode 42 is a discharge electrode to cause discharge between the sputter electrodes 41 and 42. The material of the sputter electrode 41 may be stainless steel or another suitable material that prevents metal release due to discharge.

The sputtering apparatus 120 has a spindle 18-1 to which a reel 15-1 (a third reel) for winding the tape 3 is secured, and a spindle 18-2 provided on the feeder side and configured to secure a reel 15-2 (a fourth reel). Protrusions or indentations may be formed in the outer surface of the spindles 18-1 and 18-2, while indentation or protrusions may be formed in the winding shafts of the reels 15-1 and 15-2. By fitting the protrusions into the indentations, the reels 15-1 and 15-2 can be fixed to the spindles 18-1 and 18-2. In the embodiment, three tapes 13 are fed at the same time. In this configuration, one of the three reels 15-2 on the feeder side (for example, the one positioned the farthest from the door of the casing 16) may be fixed to the spindle 18-2, and the other two may be free to rotate about the spindle 18-2. With such a configuration, even if the number of turns differs among the tapes 13, the individual tapes 13 can continuously and stably undergo the sputtering, without slacking. It is preferable that the tape with the highest number of turns, namely, the tape which will run at the fastest speed, is installed on the reel 15-2 fixed to the spindle 18-2.

In the embodiment, the tape 13 is fed so that the surface of the tape 13 is parallel to the disk surfaces of the sputter electrodes 41 and 42. To achieve this, the wheels of the reels 15-1 and 15-2 are arranged perpendicular to the disk surfaces of the sputter electrodes 41 and 42. Consequently, a conductive film is formed by sputtering on one surface of the tape 13, thereby imparting conductivity to the tape 13.

The entirety of the sputtering apparatus 120 is placed in a casing 16. As shown in FIG. 5, the casing 16 accommodates the sputter electrodes 41 and 42 which face each other, the reels 15-1 and 15-2, the tapes 13 fed between the associated reels, and other components. A vacuum evacuation mechanism 19 such as a vacuum pump (not shown) is provided to the casing 16 to evacuate the inner space of the casing 16. A door with a window may be provided to the front wall of the casing 16, such that the inside of the casing 16 can be visually monitored. By opening and closing the door, the tapes 13 can be set in or taken out of the casing 16. The window is formed of a transparent substrate. From the viewpoint of heat resistance and chemical resistance, a transparent resin substrate such as an acrylic resin plate or a polycarbonate plate, or a glass plate may be used as the transparent window.

The sputtering apparatus 120 has a power supply (not illustrated) to apply a voltage between the sputter electrodes 41 and 42, and a current regulator (not illustrated) to control the current level through an electric circuit, such that a predetermined quantity of sputter current flows between the sputter electrodes 41 and 42. The voltage applied from the power supply may either be a DC voltage or an AC voltage, and even a radio frequency (RF) power supply may be used. In terms of downsizing the apparatus, direct current power supply is preferable.

When a voltage is applied by the power supply between the sputter electrodes 41 and 42 facing each other, discharge occurs between the sputter electrodes 41 and 42. The gas ions generated in the ionized atmosphere collide with the sputter electrode 41 serving as the sputtering target, and atoms are ejected and sputtered from the sputtering target, namely, the sputter electrode 41. The atoms ejected from the sputtering target adhere to the surface of the tape 13 being fed so as to face the sputter electrode 41, whereby the surface of the tape 13 becomes electrically conductive.

A driver 17 drives and rotates the spindle 18-1. The rotating speed is automatically controlled by an electric circuit, whereby the reel 15-1 fixed to the spindle 18-1 is rotated to wind the tape 13 at a predetermined speed. The feeder-side spindle 18-2 which receives the reel 5-2 is rotated by the tension of the tape 13 being wound by the reel 15-1. By rotating the spindle 18-1 by the driver 7, the tape 13 is wound from the reel 15-2 to the reel 15-1 at a predetermined feeding speed. The driver 7 is, for example, a motor with a decelerator. An appropriate braking condition may be experimentally determined in advance.

The sputtering apparatus 120 has a brake mechanism 20 which applies a frictional force to the spindles 18-1 and 18-2 to control the rotation speeds. The brake mechanism 20 can be configured by, for example, setting a long plate in the casing 16 so that a part of the long plate is in contact with the outer periphery of the spindle 18-2. One end of the long plate is fixed inside the casing 16, and the other end is brought into contact with the outer periphery of the spindle 18-2, such that a frictional force is generated between the spindle 18-2 and the long plate to control the rotation speed of the spindle 18-2. For the long plate, a material tolerant to sputtering causing little deterioration and having a certain degree of elasticity can be used. Examples of such a material include stainless steel such as SUS. When the long plate is made of a metal such as stainless steel, a resin sheet may be provided onto the outer surface of the spindle 18-2 at the position where the metal plate comes into frictional contact with the spindle. Depending on the type of resin, the frictional force generated at the spindle 18-2 can be adjusted so as to regulate the rotation speed. For such a resin, Teflon (registered trademark) can be used. Although in the sputtering apparatus 120 of the embodiment, the spindle 18-1 also has a similar braking mechanism, the braking mechanism may be provided to only one of the spindles, as necessary.

Figure 6:
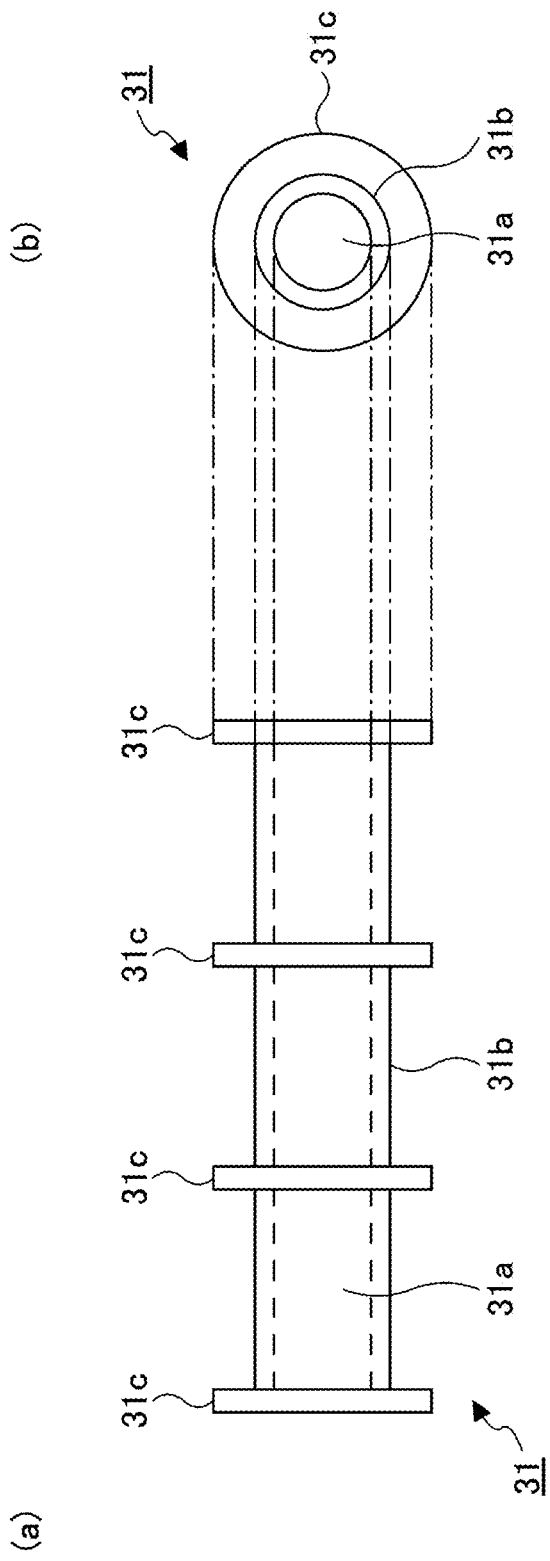
FIG. 6 is a schematic diagram showing an example of the mechanism (of a guide shaft) for guiding a tape in a sputtering apparatus according to an embodiment.
Figure 7:
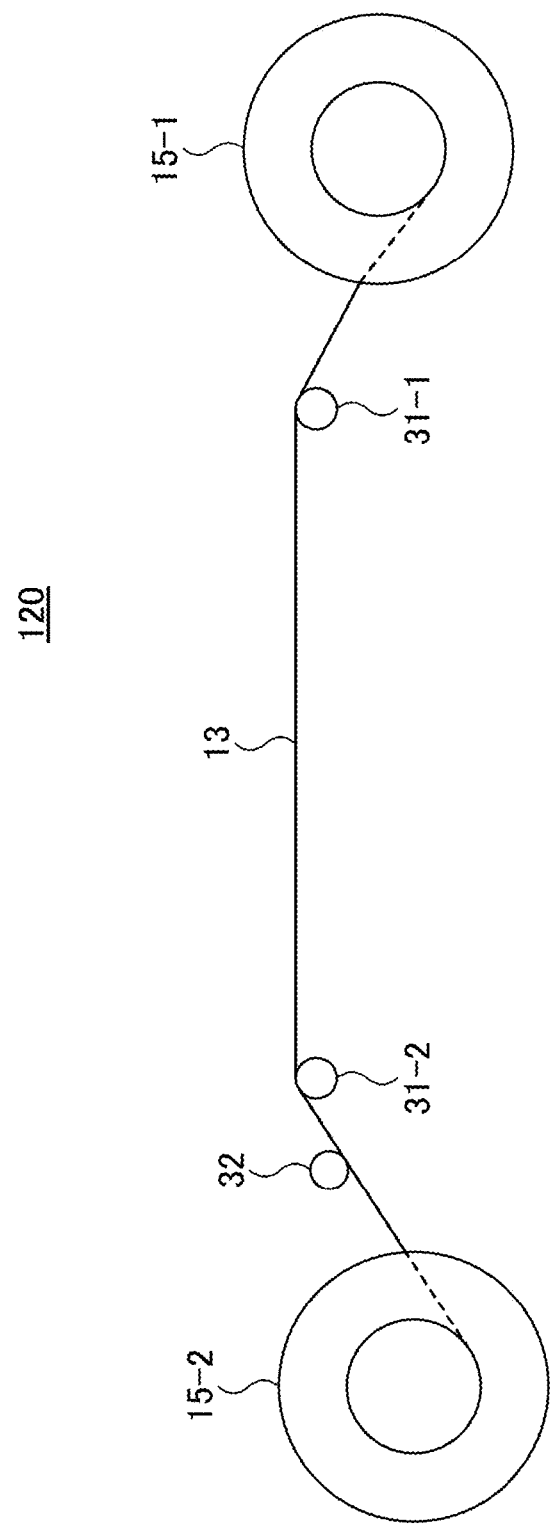
FIG. 7 is a schematic diagram showing how the tape is guided by the guide shafts in the sputtering apparatus according to an embodiment.

The sputtering apparatus 120 has guide shafts 31 and a guide shaft 32 configured to guide the tape from the reel 15-2 to the reel 15-1. FIG. 6 is a schematic diagram illustrating the guide shaft 31 in a plane view (a) and a front view (b). FIG. 7 is a schematic diagram illustrating the tape 13 guided by the guide shafts 31 and the guide shaft 32, which is viewed in the X-Z plane parallel to the wheels of the reels 15-1 and 15-2. The guide shafts 31 are provided on the reel 15-1 side and the reel 15-2 side, respectively, so that the tape 13 guided by the guide shafts 31 passes through the center area of the sputter electrode 42. As illustrated in FIG. 6, the guide shaft 31 has a cylindrical shaft 31a, an outer cylinder 31b surrounding the cylindrical shaft 31a, partitions 31c to separate the guide surface into multiple guide areas to guide multiple tapes 13, and stopper plates 31d. The outer cylinder 31b is provided so as to freely rotate around the cylindrical shaft 31a. The stopper plates 31d are provided to both ends of the guide shaft 31 so as to prevent the tape 13 from coming off the shaft guide 31. The partitions 31c and the stopper plates 31d are made of, for example, disks having a diameter greater than the inner diameter of the guide shaft 31. It is preferable for the tape 13 to be guided such that the surface to be subjected to sputtering does not touch the guide shaft 31.

The structure of the guide shaft 32 is the same as that of the guide shaft 11 illustrated in FIG. 2 and FIG. 3. The guide shaft 32 is different from the guide shaft 31 in that no partitions 31b are provided. When the tape 13 comes into contact with the outer cylinders of the guide shafts 31 and 32, the tape 13 can run in the sputtering area without slacking. Further, the partitions 31c can prevent the tapes 13 from touching each other. With these configurations, conductivity is uniformly imparted to the surface of the tape 13.

Figure 8:
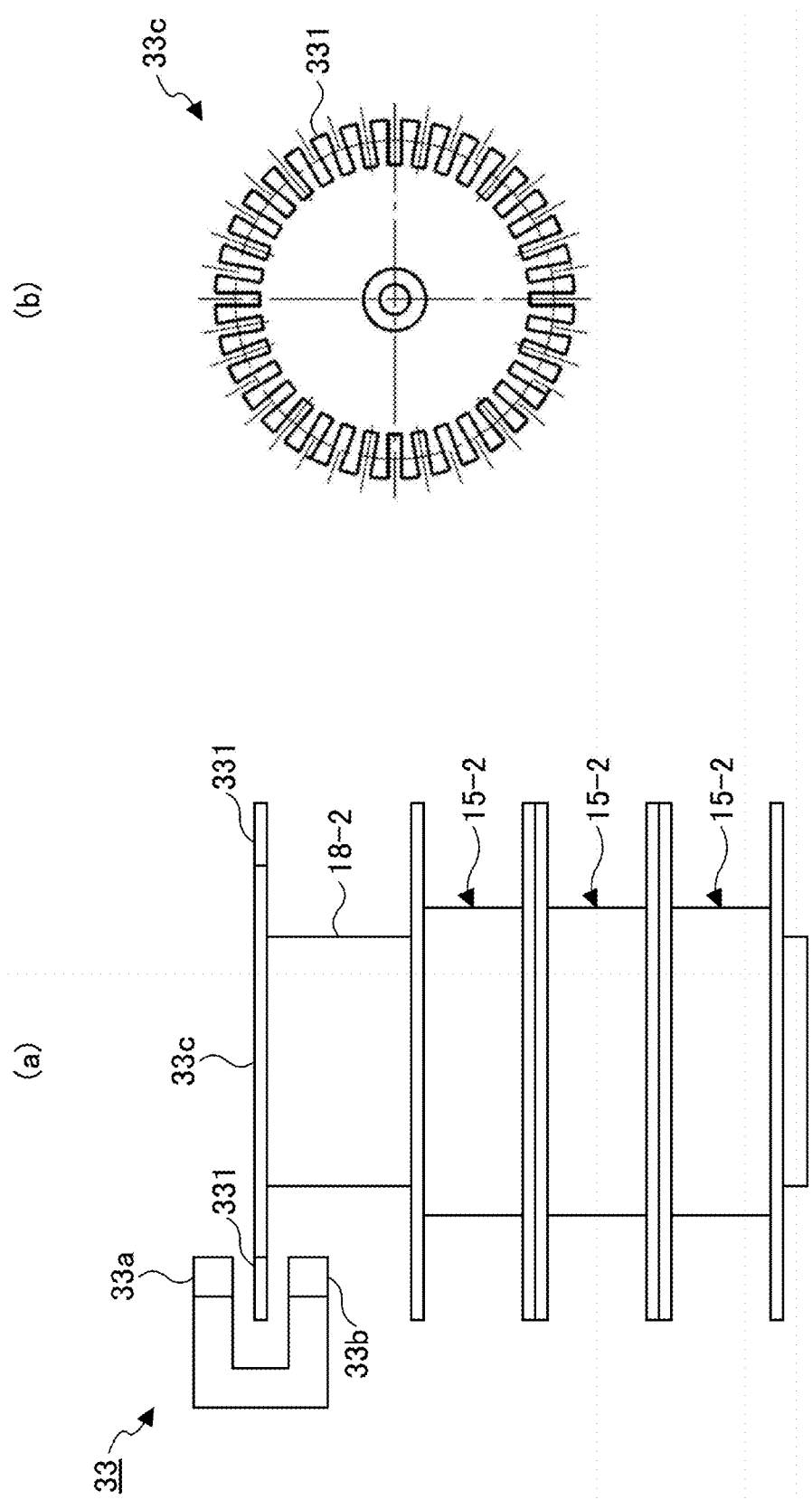
FIG. 8 shows an example of a sensor provided to the sputtering apparatus.

The sputtering apparatus 120 has a sensor 33 to confirm whether the tape 13 is running through the sputtering area. FIG. 8 is a schematic diagram of the sensor 33 used in the sputtering apparatus 120, in which diagram (a) shows how the sensor 33 is provided, and diagram (b) shows a flanged disk of the sensor 33. As illustrated in FIG. 8, the sensor 33 has a light source 33a for emitting a light beam, a photodetector 33b for detecting the light beam emitted from the light source, and a flanged disk 33c. With the sensor 33, the light beam emitted from the light source is detected by the photodetector which is provided so as to face the light source 33a. The light source 33a can be appropriately selected in combination with the photodetector 33b. A high directivity LED may be used as the light source 33a.

The flanged disk 33c has a flange 331 having slits along its circumference. The flanged disk 33c is fixed to the spindle 18-2 in such a manner that the flange 331 passes between the light source 33a and the photodetector 33b, and that the flanged disk 33c rotates together with the spindle 18-2. The light beam emitted from the light source 33a is incident on the photodetector 33b through the slit of the flange 331. When the spindle 18-2 rotates, the slit and the plate of the flange 331 are alternately irradiated with the light beam, so that the photodetector 33b detects on and off of the light beam. As has been described with reference to FIG. 1A, the sputtering apparatus 120 has a controller 125. When the photodetector of the sensor 33 detects on and off of the light beam reflected from the tape 13, the controller 125 determines that the tape 13 passes through the sputtering area. If the photodetector of the sensor 33 does not detect the light beam reflected from the tape 13 for a predetermined period of time, or if the photodetector continuously detects the light beams, then the controller 125 determines that the tape 13 is out of the path through the sputtering area, and that the process for imparting conductivity to the tape 13 having been wound around the reel 15-2 is finished. In this case, the driver 7 and the power supply are stopped.

The sputtering apparatus 120 may have a current regulator that adjusts the current (or the voltage). For example, the voltage applied by the current regulator is 0.8 KV or 1.4 KVDC, and the current is adjustable between 0 and 50 mA. The casing 16 may be provided with an evacuation mechanism, whereby the inside of the casing 16 can be vacuum-evacuated to 8 Pa. The casing 16 may have a needle valve 23 to introduce a gas (such as the air or oxygen).

By furnishing the sputtering apparatus 120 with a tape feed mechanism, which includes reels 15-1 and 15-2, spindles 18-1 and 18-2, guide shafts 31 and 32, the driver 17, and the braking mechanism 20, and with a sensor 33 for detecting the running state of the tape 13, the sputtering apparatus 120 can be made simple and compact.

Figure 9:
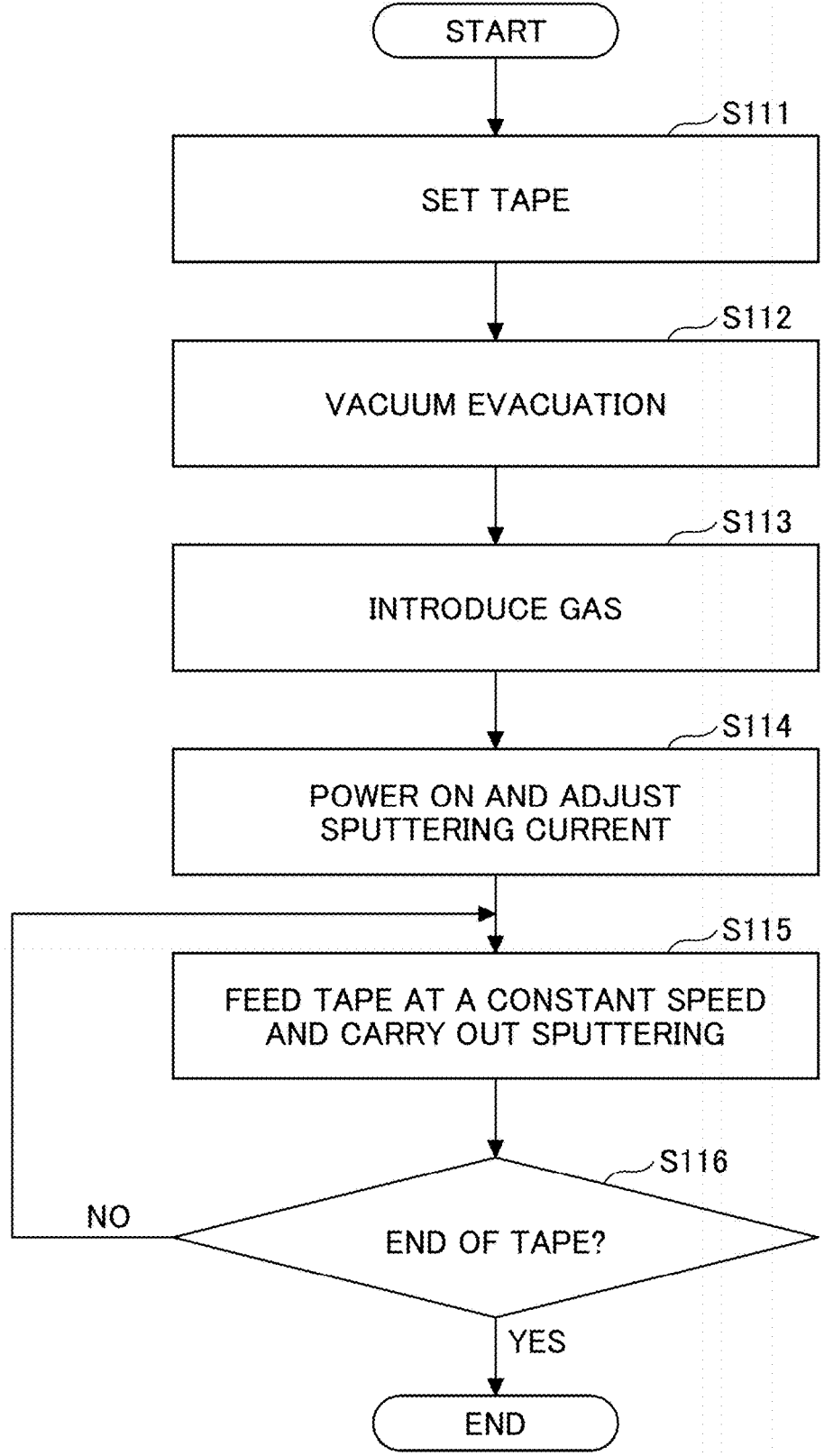
FIG. 9 is a flowchart showing operations of the sputtering process according to an embodiment.

FIG. 9 is a flowchart showing operations of the sputtering apparatus 120. Referring to FIG. 9, particulars of the sputtering step (S3) of FIG. 1B are explained.

In S111 of FIG. 9, the tape 13 is set in the sputtering apparatus 120. The door with a window, which is provided to the front surface of the casing 16 of the sputtering apparatus 120 shown in FIG. 5, is opened, and a reel with the tape 13 wound in advance, which is to be subjected to the conductivity imparting process, is set to the position of the reel 15-2 of the feeder side. One end of the tape 13 is pulled out, and brought into contact with the guide shafts 31 and 32 so as to let the tape pass through the center of the casing 16. The tape 13 is then put into the reel 15-1 at the wind-up side. The reel 15-1 is slightly rotated to wind up the tape 13. Then, the driver 17 is driven to confirm that the tape 13 is fed in the right direction (in X direction of FIG. 5).

In S112, vacuum evacuation is performed to evacuate the chamber of the sputtering apparatus 120. After the tape 13 is tensed between the reels 15-2 and 15-1 in S111, the front door is closed and vacuum evacuation is carried out.

In S113, a gas is introduced into the chamber. After the evacuation of S112, a desired gas is introduced as necessary, and the gas pressure is adjusted to a predetermined level, which has been experimentally determined in advance. The gas to be introduced may be argon, nitrogen, dried air, etc. The sputtering pressure is adjusted to about 3 MPa (gauge pressure) after the vacuum evacuation of the chamber. The inner pressure of the chamber may be such a level that allows the sputtering current to appropriately flow, and 3 MPa is sufficient to perform sputtering.

In S114, a voltage is applied between the sputter electrodes 41 and 42, and the current level flowing between the sputter electrodes is adjusted. The sputtering voltage of a predetermined level (e.g., 0.8 KV to 1.4 KV) is applied in the atmosphere of the chamber 16 having been adjusted in S113, such that the sputtering current flows at the predetermined level.

The sputtering current of about 10 mA to 50 mA is preferable. With the sputtering current at or below 50 mA, deformation or degradation due to overheating of the resin tape can be suppressed. In addition, the graininess of the sputtered heavy metal on the resin tape is less likely to be deteriorated. When slices are collected onto the resin tape, the slices are prevented from being wrinkled or damaged. With the sputtering current at or above 10 mA, a sufficient level of conductivity is imparted to the resin tape, so that satisfactory imaging can be achieved during electron microscope observation. The sputtering current of 10 mA to 40 mA is more preferable, and it may be about 10 mA. Because the sputtering current depends on the type of tape, the type of sputtering atmosphere (gas), the sputtering pressure, the type of sputtering target, etc., it is preferable to determine and set the optimum current in advance by an experiment.

In S115, the tape 13 is fed at a constant speed for the sputtering. After the sputtering voltage and current have been adjusted to the appropriate levels in S114, the driver 17 shown in FIG. 5 is driven to feed the tape 13 at a predetermined speed to impart conductivity to one surface of the tape 13.

The tape feeding rate during the sputtering is preferably about 10 to 20 minutes per 200 mm, and the tape stay time (with respect to a 200 mm resin tape) may be increased as necessary. If the tape feeding rate is too high, the cumulative stay time of the resin tape in the chamber becomes short, and it may be difficult to form a satisfactory conductive film. Assuming that the number of rotations of the reel for winding the tape is constant, the greater the number of turns of the resin tape, the shorter the time taken for the resin tape to pass under the target. For this reason, if the resin tape passes through the sputtering area only once, the thickness of the conductive film may differ between the beginning and the end of the resin tape. The sputtering may be performed repeatedly in order to increase the cumulative stay time of the resin tape staying under the target (in the sputtering area) in the chamber.

In S116, it is determined whether the tape feeding has been completed (or whether the tape end has been detected). When the driver 7 is turned on in S115, monitoring by the sensor 33 is performed as to whether the winding of the tape 13 having been subjected to the sputtering is finished. If the monitoring result of the sensor 33 is affirmative, the feeding of the tape 13 is stopped by turning off the driver 7 to terminate the process. If the monitoring result of the sensor 33 is negative, S115 is repeated.

In this manner, the sputtering apparatus 120 of FIG. 5 is operated to feed the tape 13 at a predetermined speed between the sputter electrodes 41 and 42 so that the tape surface is parallel to the surface of the sputter electrodes. With this configuration, one surface of the tape 13 is subjected to uniform sputtering, and conductivity is imparted to the tape 13.

In the sputtering apparatus, a single resin tape may be fed, or alternatively, two or more resin tapes may be fed in parallel. When the number of resin tapes simultaneously fed increases, the thickness of the conductive film formed on the outermost resin tape tends to be thinner, and the thickness of the conductive film is likely to vary among the tapes. To avoid this inconvenience, it may be preferable to simultaneously process at most three tapes, although it depends on the size of the sputtering target.

If the conductive film formed on the surface of the resin tape is too thick, the film surface becomes uneven, and the flatness of the resin tape may be impaired. Accordingly, it is preferable to coat the resin tape with as thin and as flat a film as possible using fine particles of a heavy metal. A surface resistance of $10^{14}$ Ω/cm or less of the resin tape coated with the conductive film is sufficient for imaging. The surface resistance is preferably about $10^{12}$ Ω/cm or less, and more preferably, $10^{10}$ Ω/cm or less for good imaging. As long as the resin tape is not charged during electron microscope observation of the slice fixed onto the resin tape, the property of the conductive film is acceptable. Therefore, the conductive film to be formed on the resin tape may be designed so as not to cause charging during electron microscope observation.

Figure 10:
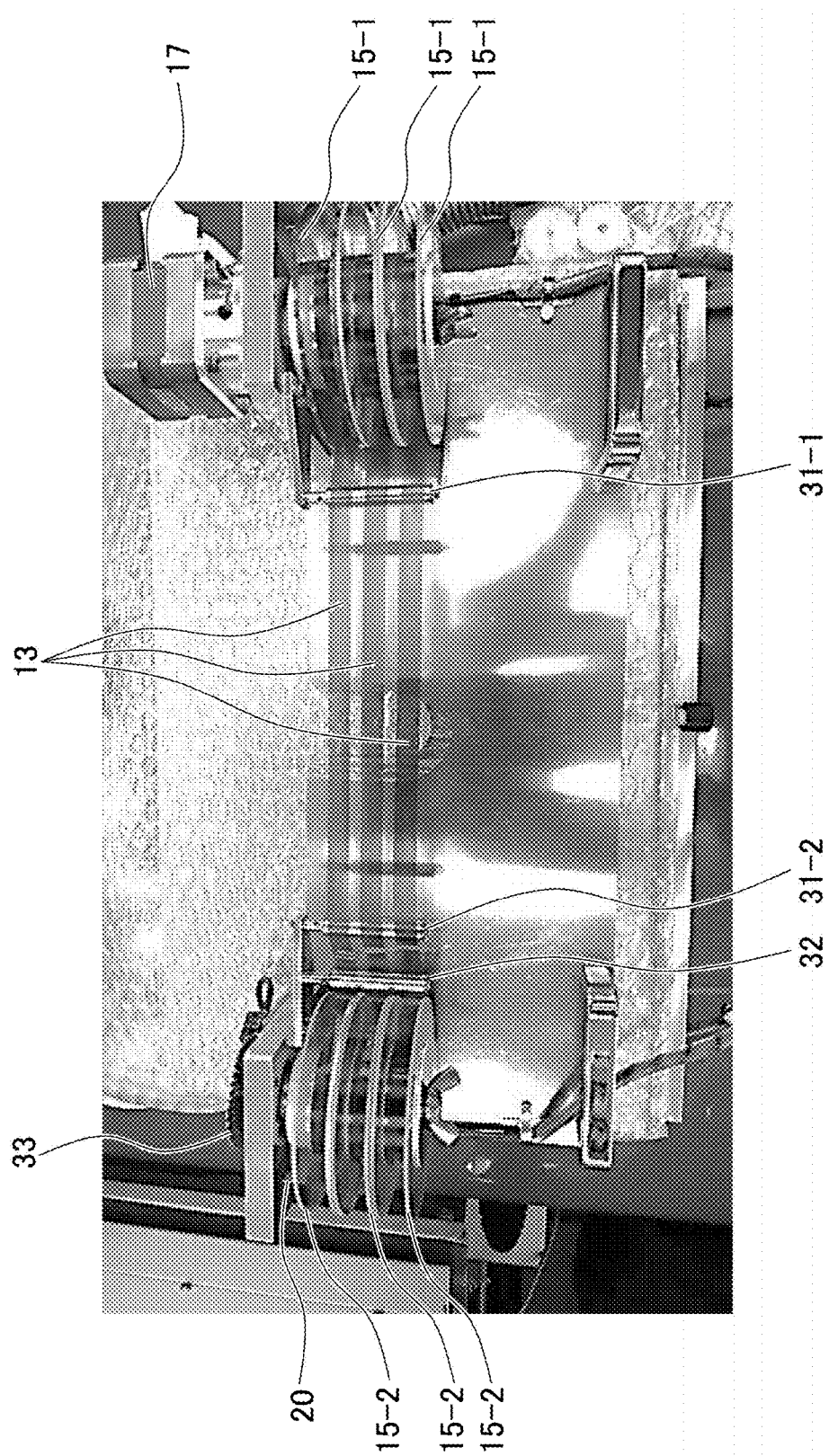
FIG. 10 is a picture showing the tape wound up in the sputtering apparatus of FIG. 5.

FIG. 10 is a photographic image showing the external appearance of three tapes 13 wound between corresponding reels 15-1 and reels 15-2 of the sputtering apparatus 120 of the embodiment. In FIG. 10, a conductive film is formed by sputtering on one surface of each tape 13. In this example, the conductive film is formed of gold.

(5) Preparation of Slices (S4)

Returning to FIG. 1B, slices are prepared in S4. In this example, a biological tissue embedded in a resin is successively sliced to prepare serial tissue slices. The kind of biological tissue is not particularly limited as long as it is an animal tissue. For example, the brain of a mouse or a marmoset, which is a laboratory animal, may be used. FIG. 11 illustrates detailed steps of slice preparation (S4) and collecting of slices (S5) according to the embodiment.

The slice preparation (S4) of FIG. 1B may include sample preparation of S4-1 and resin embedding of the subsequent step S4-2 shown in FIG. 11. In the sample preparation of S4-1, a biological tissue is picked. In the resin embedding of S4-2, the biological tissue acquired in S4-1 is resin-embedded to prepare a resin embedding block (tissue block 51). Slices for specimen are cut out from the tissue block 51.

Resin embedding can be carried out by a known technique. In the embodiment, the tissue is sequentially immobilized by glutaraldehyde (2.5 wt %) and osmic acid (1 wt %), and then embedded with an epoxy resin and polymerized to prepare a resin-embedded block. Instead of this method, another resin embedding method used for transmission electron microscope (TEM), scanning electron microscope (SEM), or immunoelectron microscope (immuno-EM) for observation of stained samples, may be employed.

In S5, slices are collected. In S5 of collecting slices (sequentially) in FIG. 11, the slices 54 are sequentially and successively cut out from the resin-embedded block (tissue block 51) prepared in S4-2, using a cutting tool such as a diamond knife 52, and collected onto the surface treated tape.

The cut-out slices 54 floating on the water contained in the water boat 59 are serially collected onto the treated tape 63, and conveyed. The slices 54 floating on the water surface in the water boat 59 are automatically and serially collected on the surface treated (conductivity-imparted) tape 63 by feeding the tape 63 (to the left of the sheet of FIG. 11).

The slices 54 generally have a thickness ranging from 25 nm to 90 nm, and preferably, 30 nm to 60 nm. The thickness of the slices 54 is more preferably 50 nm. If the slice 54 is too thin, it may be difficult to cut out from the tissue block. If the slice 54 is too thick, charging may occur during electron microscope observation, and observation may become difficult.

Returning to FIG. 1B, in S6, the resin tape on which individual slices 54 have been mounted in S5 is cut into a strip with a predetermined length to produce tape strips with slices 54. One or more slices 54 sequentially fixed onto the tape are aligned on each of the tape strips.

In S7, electron staining is performed on the slices fixed onto the tape strip. For the electron staining, uranium staining using a saturated uranium acetate solution, or lead staining using a Reynolds lead solution may be performed.

In the embodiment, electron staining can be carried out after the slices 54 cut out from the biological tissue have been fixed on the surface of the conductivity-imparted tape 63. Electron staining can be performed directly on the thin slices having a thickness of 25 nm to 90 nm. Further, a plurality of slices 54 mounted on the tape 63 can undergo electron staining at the same concentration, and high-contrast and high-resolution electron staining can be achieved.

In contrast, with the conventional method of performing electron staining on a thick and large tissue block before the tissue block is cut into slices, the degree of electron staining varies between the surface and the inside, and uniform and full electron staining cannot be achieved, unlike the embodiment.

In S8, the tape strips, which were cut in S6 and subjected to electron staining in S7, are arranged on a wafer for electron microscope observation. The tape is laid out on and fixed onto the wafer using a conductive paste (such as silver paste) for electron microscopy.

Figure 12:
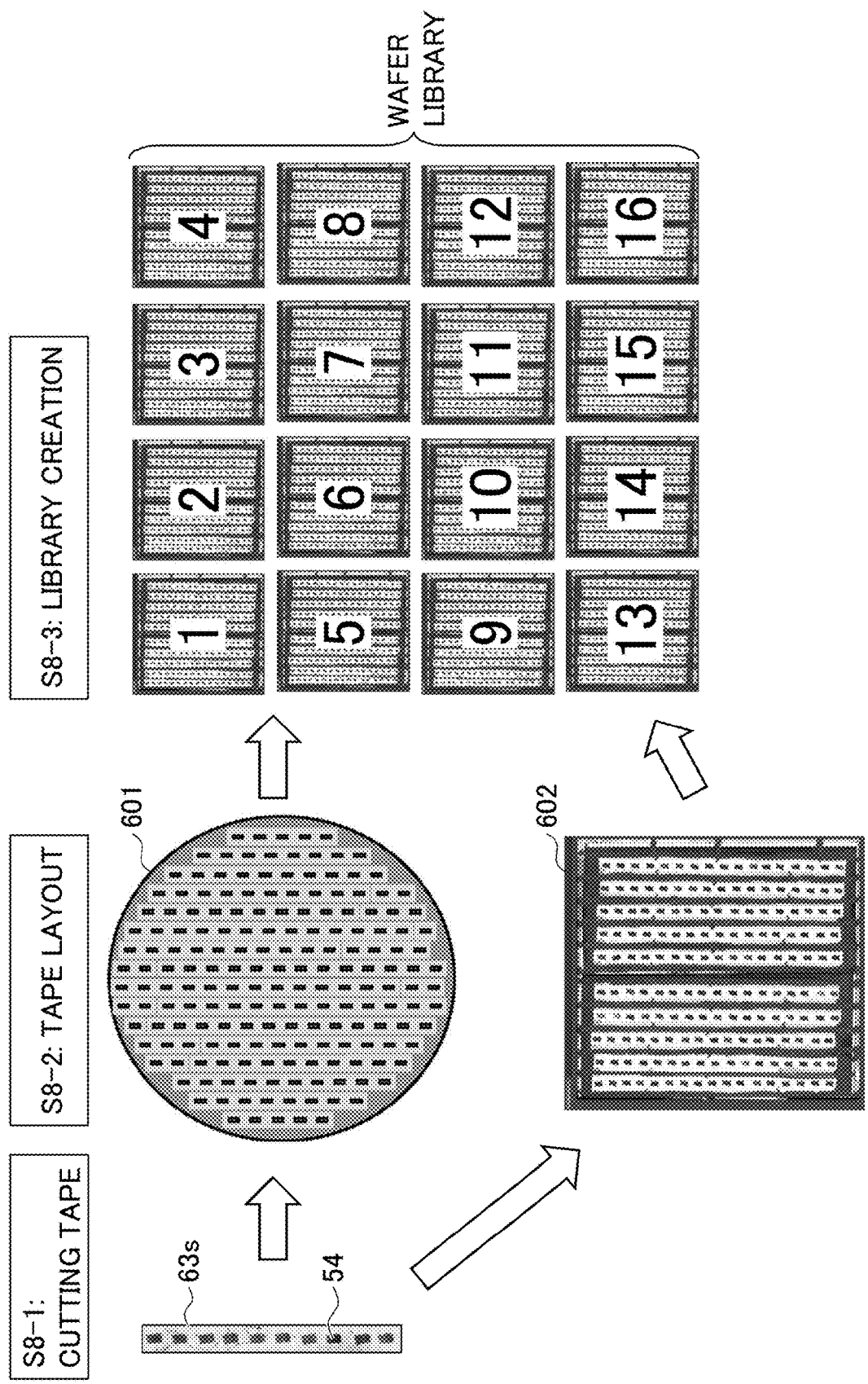
FIG. 12 shows an arrangement of cut tapes on a wafer (S8) according to an embodiment.

FIG. 12 shows arrangement of cut tape strips 63 on a wafer (S8).

In S8-1 of FIG. 12, a tape strip 63s with one or more slices fixed thereto is prepared. The tape strip 63s has such a length that a predetermined number of slices 54 are mounted. The length of the tape strip 63s may be determined according to the size of the wafer onto which the tape strip 63s is attached. The tape strip 63s has already undergone either one or both of hydrophilic treatment on both surfaces in S2 and sputtering (conductivity-imparting treatment) on one surface in S3, as necessary. Further, the slices on the tape strip 63s has already undergone electron staining.

In S8-2 of FIG. 12, the tape strips 63s are sequentially placed onto the wafer. Either a wafer 601 with a circular disk shape or a wafer 602 with a rectangular shape may be used. A double-sided conductive carbon tape is attached to the surface of the wafer, and the tape strips 63s stained with heavy metal are sequentially arranged onto the double-sided conductive carbon tape. After the arrangement, the slices are fixed onto the wafer by a conductive paste for electron microscopy, such as silver paste or carbon paste. The size of a disk-shaped wafer 601 can be selected from 4, 5, 6, 7, 8 inches, etc. as necessary.

When a rectangular wafer 602 is used, an extra process for cutting a disk-shaped wafer into a predetermined rectangular shape is required, compared with the case using a circular wafer 601 as it is. However, the rectangular wafer has an advantage that tape strips 63s are cut at a constant length. By keeping the cutting length of the tape strips 63s constant, the number of slices 54 mounted on the respective tape strips 63s is the same, and the number of tape strips observable at a time with a multi-beam scanning electron microscope is maximized.

In S8-3 of FIG. 12, a library is created. A number of wafers, each of which has arrangement of tape strips 63s with slices 54 mounted, are stored and administered. By creating a library in which a number of wafers are arranged, slices 64 successively cut out from a resin-embedded biological tissue block 51 can be arranged in an array and stored. In addition, an electron microscope image of a slice 54 selected from a desired location can be observed and analyzed. The observation of the slices 54 picked up from the desired location can be repeated as many times as required at a later date.

Returning to FIG. 1B, in S9, slice observation, imaging, and analysis are performed using the sample for electron microscopy prepared according to the above-described technique. By using the sample for electron microscopy prepared by the technique of the embodiment, the slices 54 aligned and fixed onto a wafer can be observed at a high contrast and a high resolution without charging even with an electron microscope.

Figure 13A:
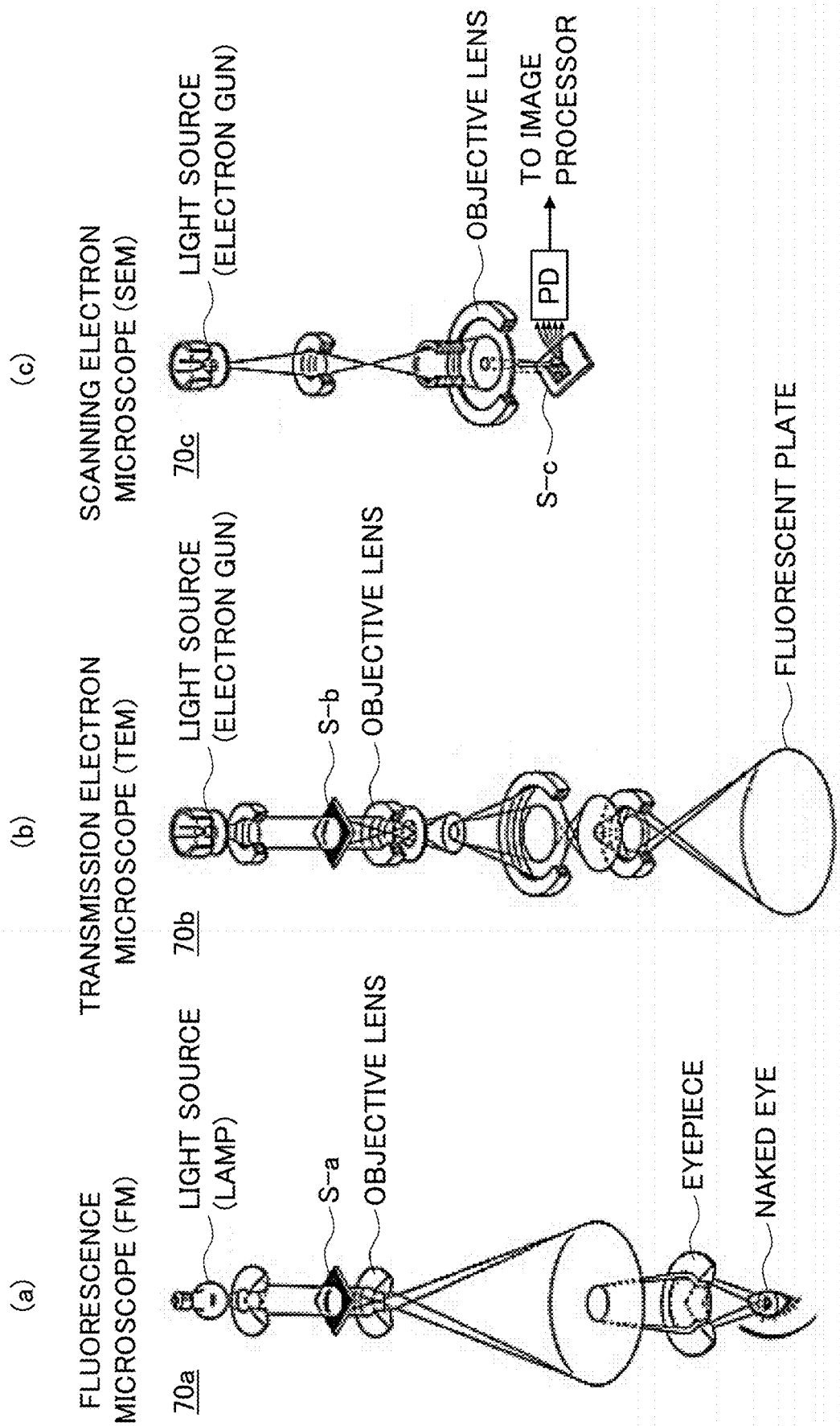
FIG. 13A shows examples of electron microscope observation (S9) according to an embodiment.

FIG. 13A shows examples of electron microscope observation, which includes fluorescence microscope observation (a) of sample S-a, TEM observation (b) of sample S-b, and SEM observation (c) of a sample S-c. In the fluorescence microscope observation (a), fluorescence from the slice 54 on the wafer stored in the library of FIG. 12 can be observed. The maximum resolution is about 200 nm, and the magnification is about 10 to 40 times.

In the TEM observation (b), a magnified image of the slice 54 can be produced at a high resolution from the electron beam having been transmitted through the slice 54, which carries useful information about the slice 54. The maximum resolution is about 0.1 nm, and the magnification is about 500 to 1.5 million times.

In the SEM observation (C), a magnified image of the slice 54 can be produced at a high resolution from the electron beam scanning the slice 54, which carries useful information about the slice 54. The maximum resolution is about 0.5 nm and the magnification is about 1 million times.

Figure 13B:
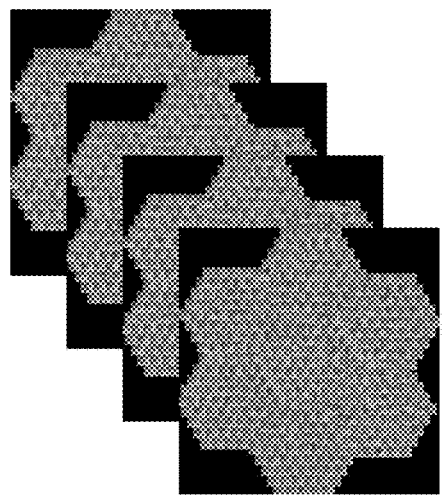
FIG. 13B shows an example of image analysis (S9) through electron microscopy observation according to an embodiment.

FIG. 13B shows an example of serial image acquisition. These images are serial images acquired by the SEM of FIG. 13A, by observing the slices 54 serially aligned and fixed on the wafer.

Figure 14:
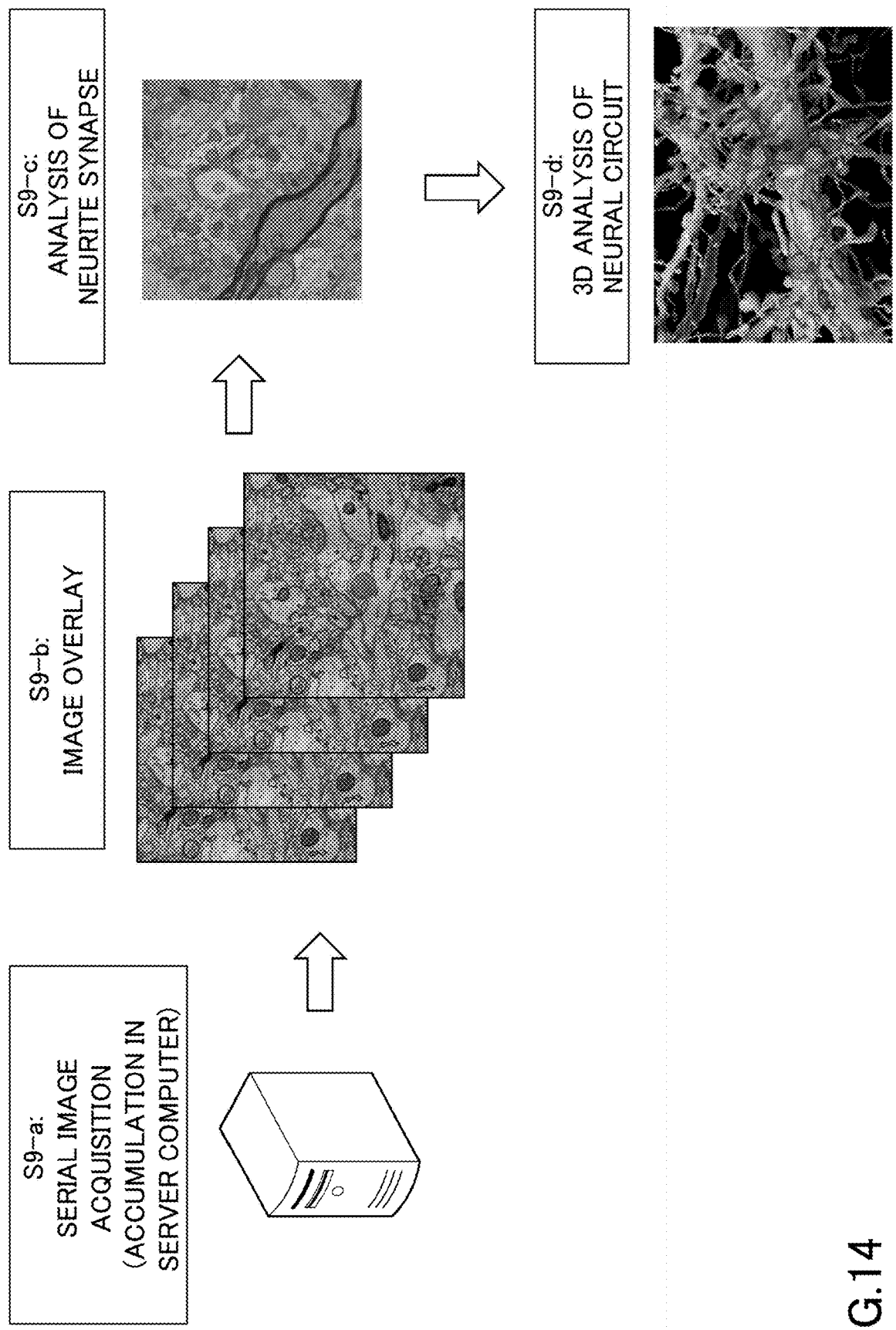
FIG. 14 is a diagram explaining electron microscope observation and image analysis (S9) according to an embodiment.

FIG. 14 shows another example of observation and image analysis (S9) of FIG. 1B. In S9-a, observed images that are sequentially acquired are stored in a server computer. The images stored in the server computer may be shared among co-researchers via a network or cloud, which allows collaborated image observation and analysis.

In S9-b, serial images of the slices stored in the server computer are overlaid in the server computer.

S9-c of FIG. 14 shows an example of a colored object to be analyzed, based on the overlaid images of S9-b. A specific portion of interest for analysis can be clarified in this manner.

S9-d of FIG. 14 shows an example of three-dimensional analysis. In the previous step S9-b, a large number of serial images to be analyzed are acquired, and among them, appropriate images are selected and overlaid to clarify the three-dimensional structure of a desired site of "neural circuit" to be analyzed. The three-dimensional structure may be reproduced (restored) based on a number of serial images in the thickness direction to create 3D image, as in S9-d.

Figure 15:
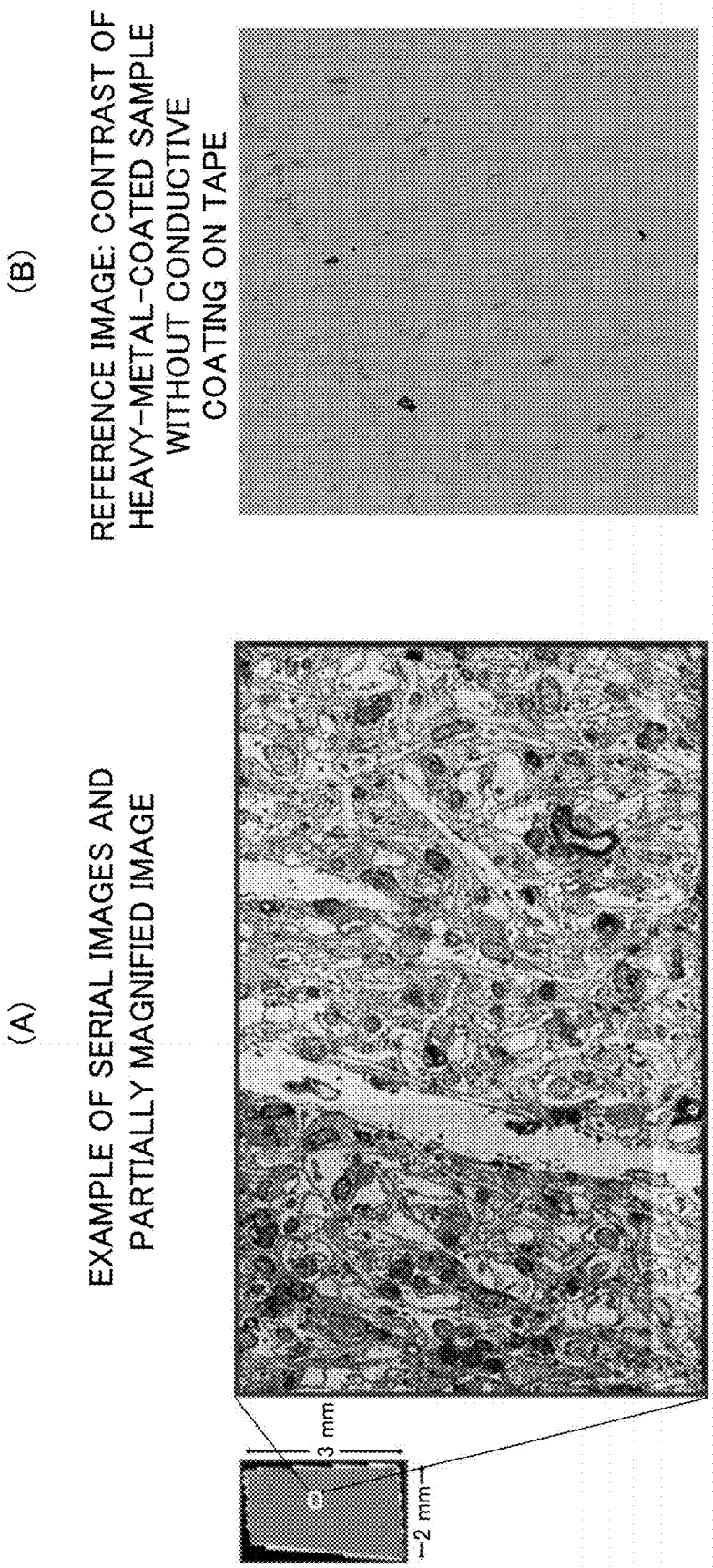
FIG. 15 shows images obtained by electron microscope observation (S9) according to an embodiment.

FIG. 15 shows electron microscope images acquired from a sample prepared by the sample preparation technique of the embodiment. The image (A) shows an example of a partially magnified image extracted from a composite image in which serial images are combined in the 2 mm×3 mm area of the slice size.

The image (B) of FIG. 15 shows a reference SEM image acquired in a comparative example. In the comparative example, no conductivity-imparting treatment was performed on the tape in advance, and instead, a conductive coat is formed over the slices mounted on the tape. In order to prevent charging during SEM observation, thin conductive (gold or carbon) coating is applied over the slices, and an electron beam is scanned two-dimensionally over the coated slice. In this comparative example, secondary electrons are emitted only from the surface of the conductive coating, and there is little emission of secondary electrons from the sample slice itself covered with the conductive coating. Consequently, the contrast is poor.

In contrast, with the electron microscope observation technique of the embodiment, secondary electron emission can be detected directly from the sample slice, which is mounted on the conductivity-imparted tape and heavy metal stained, without applying a conductive coating over the slices. A high contrast and high resolution image (A) can be acquired in FIG. 15.

ACTUAL EXAMPLES

Next, actual examples will be described; however, the invention is not limited to the following examples. Serial TEM images of slices collected from a marmoset brain were acquired according to the process shown in FIG. 1B.

Hydrophilization of Resin Tape

A Kapton (registered trademark) tape made of polyimide with a thickness of 40 µm and width of about 8 mm was used as the resin tape. Both surfaces of the resin tape were wiped and cleaned with ethanol.

Using the plasma treatment apparatus 110 with the same structure as that shown in FIG. 2, the resin tape was fed in the chamber to hydrophilize both surfaces of the tape. For the plasma treatment, the chamber of the plasma treatment apparatus was vacuum evacuated, and then the oxygen gas atmosphere was created. The plasma current was adjusted to 25 mA. By regulating the revolution rate of the spindles, the tape feeding speed was set in the range from about 30 seconds to 1 minute per 200 mm. Thus, a resin tape with both sides hydrophilized was fabricated. The hydrophilized resin tape was wound up on a reel provided at the wind-up side of the plasma treatment apparatus 110. In the plasma treatment apparatus 110, one reel is set on the tape introducing side, and one reel is provided on the wind-up side. The tape was fed between the reels so that the tape surface was perpendicular to the surfaces of the plasma electrodes 2 which faced each other to perform plasma treatment on a single tape. The inner diameter of the reel is 40 mm and the outer diameter is 75 mm. During the winding of the tape, the diameter of the tape wound around the wind-up reel increased according to the thickness of the wound tape. The tape feeding speed also increased as the diameter of the wound tape increased.

Imparting Conductivity to Resin Tape

A conductive film was formed on the hydrophilized surface of the resin tape according to the following process. Using the sputtering apparatus 120 with the same structure as that shown in FIG. 5, the resin tape was fed in the chamber to form a conductive film on one surface of the resin tape. The resin tape was fed twice in the chamber under the conditions of a current level of 10 mA and a feeding speed of 10 to 20 minutes per 200 mm set to the apparatus. The tape wound up at the first time on the wind up-side reel was removed, and set again to the tape introducing side of the sputtering apparatus 120. The tape was then fed from the opposite end of the tape in the chamber. The inside of the chamber was evacuated. A gold target was used as the sputtering target. In the sputtering apparatus, three reels were provided on the tape introducing side, and three reels were provided on the tape wind-up side. Three tapes were fed and sputtered simultaneously, such that the tape surfaces were parallel to the surface of the sputter electrodes which face each other. The inner diameter of the reel of the sputtering apparatus is 40 mm and the outer diameter is 75 mm. As the tape was wound around the wind-up reel, the diameter of the tape being wound increased according to the increase of the thickness of the wound tape. The tape feeding speed also increased as the diameter of the tape being wound increased.

Preparation of Slices

The brain picked from a marmoset was cut into a block with an appropriate size, and immobilized with 2.5 wt % glutaraldehyde and 1 wt % osmic acid in turn. Then, the brain block was embedded with epoxy resin and polymerized for 72 hours or more. Thus, a resin-embedded block was fabricated.

Collecting of Slices

Using a diamond knife with a water boat, the resin-embedded block was successively cut into slices having a thickness of 50 nm. The cutout tissue slices were serially collected onto the conductivity-imparted surface of the resin tape, owing to the buoyancy of the water in the boat.

The resin tape on which the tissue slices were serially arranged was cut into tape strips with a predetermined length, according to the size of a silicon wafer (4 inches in diameter) for SEM observation. Then electron staining was performed using uranium (saturated uranium acetate solution) and then using lead (Reynolds lead solution). The heavy-metal stained resin tapes were serially arranged on the silicon wafer. Then a conductive silver paste for SEM was applied onto the surface of the silicon wafer to fix the tissue slices onto the wafer.

In this manner, an observation wafer, on which tissue slices cut out from the resin embedding block were serially fixed in the slicing order, was obtained. Using this observation wafer, multi-beam serial observation and serial imaging were performed with a multi-beam SEM. The image (A) shown in FIG. 15 is one of the observation results. The surface resistance of the conductivity-imparted resin tape used for capturing the image (A) of FIG. 15 was measured prior to collecting the slices. The surface resistance was measured using High Leicester UX (manufactured by Mitsubishi Chemical Analytical Co., Ltd.). The measuring result was $10^{10}$ Ω/cm or less.

The target used in the sputtering apparatus was replaced with a Pt—Pd alloy target (Pt 90 wt % and Pd 10 wt %). With the Pt—Pd alloy target, an image with a contrast adequate for analysis was obtained, although the contrast was slightly lowered compared with the previous example.

The SEM observation was conducted in the same manner, while changing the current level of the sputtering apparatus between 20 mA and 40 mA. At either current level, a clear image the same as those of the above-described examples was obtained at a high contrast. With the 40 mA sputtering current, fine wrinkles or lines were observed in a part of the tissue slices collected on the resin tape; however, it is inferred that such fine wrinkles or lines were due to the target particles sputtered onto the surface of the resin tape.

In the above examples, SEM observation was performed using a marmoset brain. Another SEM observation was also conducted using a mouse brain. In this case, a high-contrast and high-resolution image was again obtained as in the image (A) of FIG. 15.

Comparative Example

As described with reference to the image (B) of FIG. 15, SEM observation was conducted in the same manner, except that no conductivity-imparting film was formed in advance on the resin tape. Namely, a resin tape on which tissue slices were serially mounted was fabricated, using a mouse brain, and tape strips were fixed onto a wafer in the same manner as the above-described examples. Then, a heavy metal carbon coating was applied onto the wafer, over the tissue slices. Multi-beam SEM observation and imaging were performed. In the captured image (B) of FIG. 15, a sufficient contrast for analysis was not obtained.

Another Example

Figure 16:
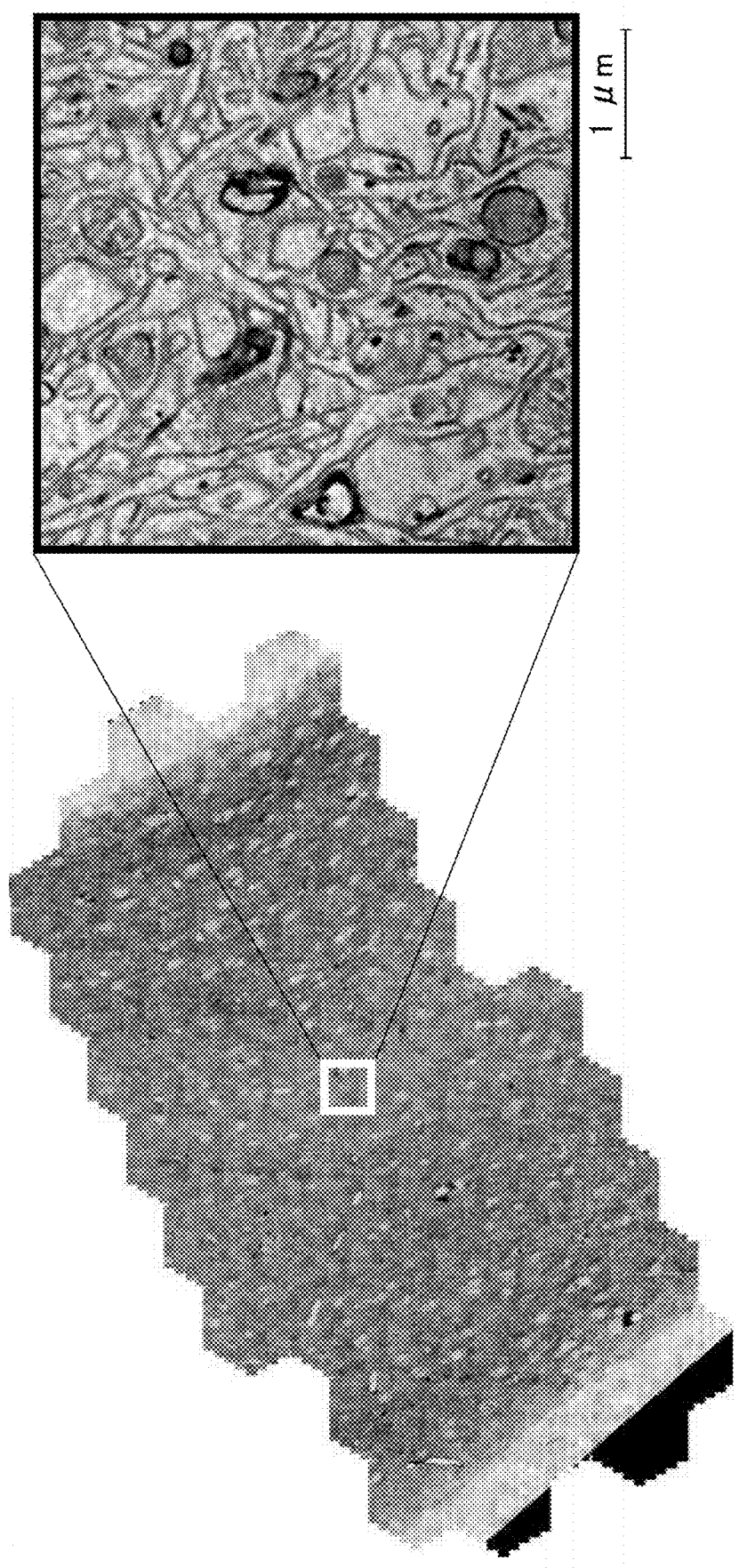
FIG. 16 shows another example of an image obtained by electron microscope observation according to an embodiment.

FIG. 16 shows a SEM observation result of a slice mounted on a polycarbonate tape. Except for the material of the tape, the width, the thickness, and the tissue slice used were the same as those used for acquiring image (A) of FIG. 15. The image of FIG. 16 is a partially magnified image from a composite image in which serial images acquired through electron microscope observation as in FIG. 13B were combined. Similar to the image (A) of FIG. 15, a sufficiently high contrast is achieved. Still other examples were conducted, using PEN, PET, and PEEK described above, instead of polycarbonate, as the slice mounting tape. Images having a good contrast were obtained, as in the image (A) of FIG. 15 or the image of FIG. 16.

This PCT international application is based upon and claims priority to the earlier filed Japanese Patent Application No. 2018-248067 filed Dec. 28, 2018, the entirety of which is herein incorporated.

LISTING OF SYMBOLS 2, 41, 42: sputter electrode
3, 13: tape
5-1, 5-2, 15-1, 15-2: reel
6, 16: casing
7, 17: driver
11, 31, 32: guide shaft
12, 33: sensor
14: conductive film
18-1, 18-2: spindle
19: evacuation mechanism
20: brake mechanism
23: needle valve
51: tissue block
52: diamond knife
53: collected slice
54: serial slices
100: sample preparation system
110: plasma treatment apparatus
115: controller
120: sputtering apparatus
125: controller
130: collecting apparatus

What is claimed is:

1. A sample preparation system for electron microscope observation comprising:
    at least one of a plasma treatment apparatus and a sputtering apparatus, the plasma treatment apparatus being configured to feed a resin tape in a plasma irradiation area to irradiate the resin tape with plasma, thereby continuously hydrophilizing the resin tape, and the sputtering apparatus being configured to feed the resin tape in a sputtering area to continuously perform sputtering on the resin tape, thereby imparting conductivity to the resin tape, and
    a collecting apparatus configured to serially collect slices cut out from a sample onto the resin tape having been subjected to plasma treatment or sputtering.

2. The sample preparation system as claimed in claim 1, comprising the sputtering apparatus,
    wherein the slices serially collected onto the resin tape are observable through electron microscopy, without conductive coating over the slices.

3. The sample preparation system as claimed in claim 1, wherein the resin tape is made of a material selected from a group consisting of polyimide, polycarbonate, polyetheretherketone, polyethylene terephthalate, and polyethylene naphthalate.

4. The sample preparation system as claimed in claim 1, comprising the plasma treatment apparatus, wherein the plasma treatment apparatus incudes:
a plasma treatment chamber;
a pair of plasma electrodes provided in the plasma treatment chamber so as to face each other;
a first power supply that applies an electric current between the pair of plasma electrodes;
a first tape feeding mechanism that feeds the resin tape in a longitudinal direction through a plasma irradiation area provided between the pair of plasma electrodes; and
a first driver that adjusts a tape feeding speed of the first tape feeding mechanism,
wherein the first tape feeding mechanism has a first reel to send out the resin tape to the plasma irradiation area, and a second reel to wind up the resin tape from the plasma irradiation area, and
wherein the first reel and the second reel are provided in the plasma treatment chamber, and the first driver applies a rotational force to the second reel so as to rotate the second reel at a predetermined rotational speed.

5. The sample preparation system as claimed in claim 4, wherein the first tape feeding mechanism feeds the resin tape such that the surface of the resin tape is perpendicular to surfaces of the pair of plasma electrodes facing each other.

6. The sample preparation system as claimed in claim 1, comprising the sputtering apparatus,
wherein the sputtering apparatus includes:
a sputtering chamber;
a pair of sputter electrodes;
a tape feeding mechanism that feeds the resin tape in a longitudinal direction through a sputtering area provided between the pair of sputter electrodes; and
a driver that adjusts a tape feeding speed of the second tape feeding mechanism,
wherein the tape feeding mechanism has a first reel to send out the resin tape to the sputtering area, and a second reel to wind up the resin tape from the sputtering irradiation area, and
wherein the first reel and the second reel are provided in the sputtering chamber, and the driver applies a rotational force to the second reel so as to rotate the second reel at a predetermined rotational speed.

7. The sample preparation system as claimed in claim 6, wherein the tape feeding mechanism feeds the resin tape such that the surface of the resin tape is parallel to surfaces of the pair of sputter electrodes facing each other.

8. The sample preparation system as claimed in claim 6, wherein a sputtering target is provided to a negative electrode of the pair of sputter electrodes, and the sputtering target is selected from a group consisting of Au, Ag, Pt, Pd, and a combination thereof.

9. A sample preparation method for electron microscope observation to prepare a slice of a sample configured on a tape, comprising:
performing a plasma treatment step or a sputtering step, the plasma treatment step including feeding a resin tape in a plasma irradiation area to irradiate a surface of the resin tape with plasma and hydrophilize the resin tape, the sputtering step including sputtering on the surface of the resin tape to impart conductivity to the resin tape; and
serially collecting slices cut out from the sample onto the resin tape having been subjected to the plasma treatment step and/or the sputtering step.

10. The sample preparation method as claimed in claim 9, further comprising:
cutting the resin tape on which the slices are serially arranged into tape strips, each of the tape strips having one or more slices, and fixing the tape strips onto a substrate; and
performing electron microscope observation or acquiring an electron microscope image, without applying conductive coating over the slices fixed to the substrate.

11. A tape feeding mechanism used in the sample preparation system as claimed in claim 1 to feed the resin tape in the plasma treatment apparatus or the sputtering apparatus, comprising:
a feed reel and a wind-up reel, the feed reel being configured to feed the resin tape, and the wind-up reel being configured to wind up the resin tape;
a spindle to which the wind-up reel is fixed and configured to revolve together with the wind-up reel;
a motor configured to rotate the spindle; and
a braking mechanism having a long plate configured to be in contact with the spindle, the braking mechanism applying a frictional force to the spindle when the spindle rotates to control a revolution rate of the spindle.

* * * * *